United States Patent [19]

Siebert

[11] Patent Number: 4,858,556
[45] Date of Patent: Aug. 22, 1989

[54] METHOD AND APPARATUS FOR PHYSICAL VAPOR DEPOSITION OF THIN FILMS

[76] Inventor: Jerome F. Siebert, 5991 S. Vale Rd., Boulder, Colo. 80303

[21] Appl. No.: 907,274
[22] Filed: Sep. 15, 1986
[51] Int. Cl.$^4$ ............................................. C23C 16/00
[52] U.S. Cl. .................................. 118/664; 118/690; 118/708; 118/715; 118/725; 118/726; 118/730; 219/72; 219/209; 156/345
[58] Field of Search ............... 118/664, 690, 708, 715, 118/725, 726, 730; 219/72, 209; 156/345

[56] References Cited

U.S. PATENT DOCUMENTS

| | | | |
|---|---|---|---|
| 4,100,879 | 7/1978 | Goldin | 118/725 |
| 4,121,537 | 10/1978 | Maruyama | 118/726 |
| 4,207,836 | 6/1980 | Nonaka | 118/730 |
| 4,403,567 | 9/1983 | daCosta | 118/724 |
| 4,515,204 | 5/1985 | Ohno | 164/483 |

Primary Examiner—Richard Bueker
Attorney, Agent, or Firm—Gerald J. Ferguson, Jr.

[57] ABSTRACT

A physical vapor deposition system is disclosed for routinely achieving unprecedented processing uniformity of thin films on substrates of a size comparable to or larger than the source. The system includes a plurality of substrates; a plurality of deposition, etching, and/or heating sources; a plurality of mobile in-situ process monitors for obtaining the fundamental processing profiles that characterize the processing properties of each source; and mobile fixturing responsive to the fundamental processing profiles for effecting prescribed motion scenarios of the substrate relative to the source; to thus provide the means for achieving extremely uniform as well as an unprecedented range of prescribed non-uniform final thin film processing profiles, irrespective of the size of the substrate relative to the size of the source.

47 Claims, 16 Drawing Sheets

TYPICAL PVD SOURCE DISTRIBUTION

FIG. 6  PHYSICAL VAPOR DEPOSITION SYSTEM FUNCTIONAL HARDWARE BLOCK DIAGRAM

FIG. 11
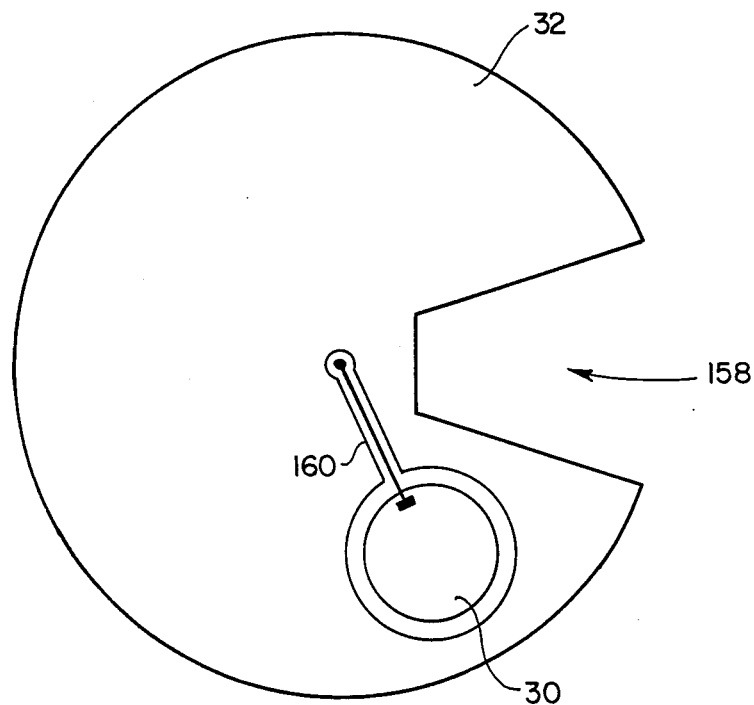
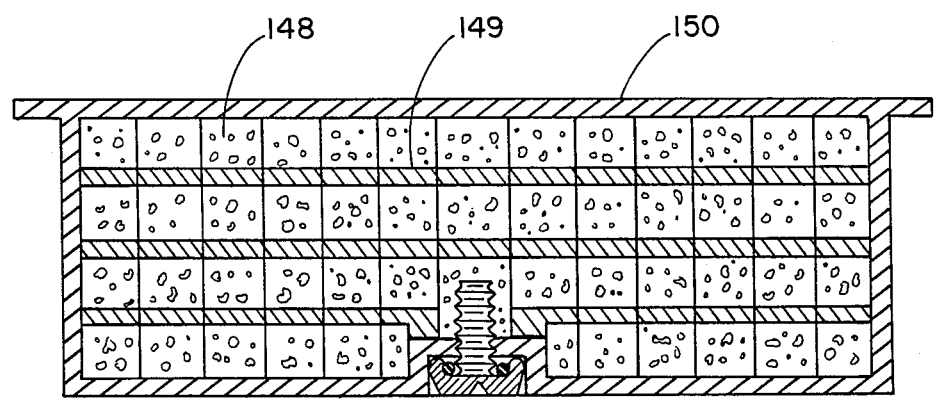
FIG. 8

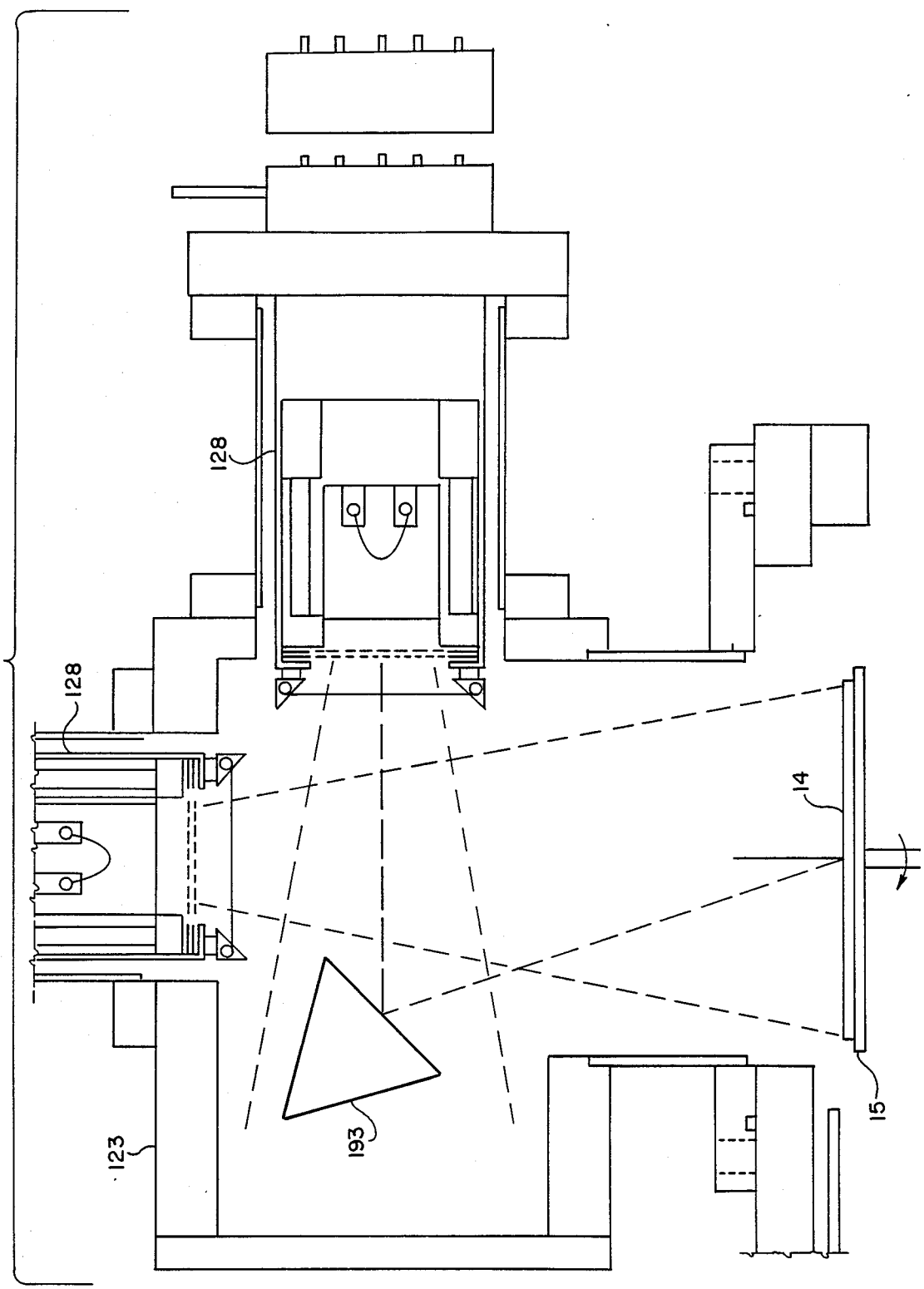

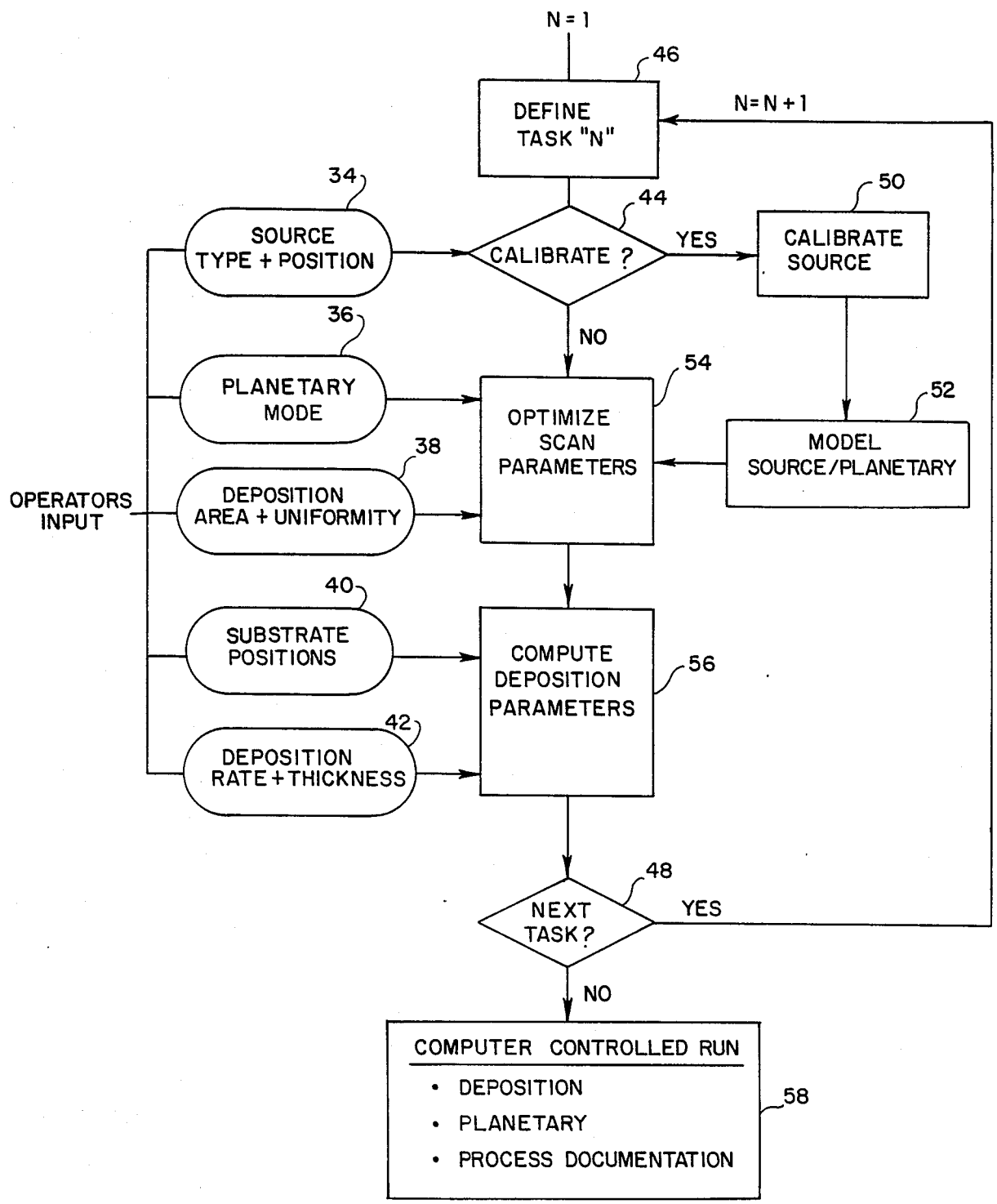
FIG. 13  PHYSICAL VAPOR DEPOSITION SYSTEM FUNCTIONAL FLOW DIAGRAM

METHOD AND APPARATUS FOR PHYSICAL VAPOR DEPOSITION OF THIN FILMS

BACKGROUND OF THE INVENTION

The present invention relates to a method and apparatus for the deposition, etch, and/or thermal processing of thin films in physical vapor deposition (PUD) systems.

Processing of increasingly pure and uniform thin films of a wide variety of materials onto an equally wide variety of types and sizes of substrate materials is a key processing requirement in the manufacture of many high technology products including integrated circuits, magnetic and optical memory media, active and passive solar energy devices, and optical coatings. There are several types of processes that may be carried out in PUD systems including thermal evaporation, ion-beam etching and magnetron sputtering, and molecular-beam epitaxy to mention just a few.

A common problem with each of these processes is how to uniformly process high-purity homogeneous films over any given substrate area, while maintaining acceptable commercial throughputs and source efficiencies. This problem is illustrated in FIG. 1 for the particular case of a ring magnetron sputtering source, although the following discussion is equally applicable to all sources commonly utililized in PUD systems. As shown in FIG. 1, the distribution of sputtered material at the substrate plane is highly nonuniform. The amplitude (deposition rate) and shape (profile) of this distribution depend not only on the type, design, and operating conditions (e.g., deposition chamber pressure) of the source, but also on the particular source material (target), the state of erosion (usage) of the source material, and the source-to-substrate spacing. (Note that the properties of the substrate may also influence the source distribution. For most sources on PUD systems this influence is typically small and/or predictable. This is to be contrasted with other thin film processing techniques such as chemical vapor deposition (CUD), where the effect of the substrate on the deposition may be a dominate factor.)

The PUD equipment industry had developed the following techniques for achieving more uniform processing of thin films:

a. Use processing sources much larger than the substrates.
b. Use tuning electric and magnetic fields, shadow masks, etc. to shape the source distribution.
c. Use substrate motion to average the source distribution.
d. Various combinations of the above.

The problem with the first brute-force technique is its obvious inefficiency. Not only is it wasteful and expensive, especially for precious metal depositions, the use of very large sources sets off a chain reaction of increased size and cost and reduced versatility in the PUD equipment design and performance. In particular, research and development (R&D) in a production PVD system (or vice-versa) is a difficult, expensive, and unrewarding undertaking. Using separate systems for R&D and production is one approach, but this requires that processing techniques developed on an R&D system be efficiently and accurately transferred to a production system. This time required in getting the product out of the laboratory and into production is one of the major problem areas in the industry.

The source size can be reduced substantially by using various techniques to shape the source distribution to give more uniform thickness deposition. However, this approach also has its problems. First, because each point on a fixed substrate has a different spatial relationship to an extended source, the homogeneity of the film can vary substantially over the substrate even when its thickness is uniform, especially for reactively deposited films. Second, each source material has different shaping requirements which makes this approach tedious and time consuming. Finally, as the source material erodes away its deposition profile changes, requiring that its source distribution be re-shaped or that it be replaced with a new target, often after only a few percent target utilization.

Various types of substrate motion, when combined with the above techniques for controlling the source distribution, are quite effective in minimizing many of the problems cited above. Mobile planetary substrate fixturing used in the industry is illustrative of this approach. These are typically constant speed mechanisms with one or more degrees of freedom designed to average the source distribution over large substrate areas in a manner that produces more uniform processing. The advantages of reduced source size and improved uniformity that result from substrate motion during the processing are quite significant, assuming that the processing environment is sufficiently clean to assure very pure processing even though the substrate repeatedly moves in and out of the processing area as a consequence of this motion. However, as currently implemented by the PVD equipment industry, these planetaries do no more than average differences in source distributions, such as those due to different source materials and states of erosion. Furthermore, constant speed planetaries are highly inefficient when used for R&D because they are designed for achieving uniform processing over the entire planetary surface, not just selected smaller portions that would be more appropriate for R&D applications.

As a result, no better than 90-95% process uniformity is the current advertised state-of-the-art performance specification for PVD equipment using various combinations of these shaping and averaging techniques, while also maintaining useful product throughputs and source efficiencies.

SUMMARY OF THE INVENTION

The approach to the present invention efficiently and reliably improves on the current state of the art in thin film processing uniformity, especially over substrates of a size comparable to or larger than the source, by providing a technique capable of quickly, accurately, and routinely dealing with the effects of differences and/or changes in various source profiles. The technique is based on the premise that if one has complete knowledge of a source distribution (of any shape), and also has complete control of a mobile substrate fixture (scanner) capable of placing any given point on the substrate at any given position in the source distribution for any period of time, then it should be possible to find a source-substrate motion scenario that produces arbitrarily high uniformity processing over substrate areas of arbitrary size. For a time-independent source distribution (i.e., constant processing rate), a time-varying motion scenario of the substrate relative to the source is typically required. Alternatively, a constant speed motion scenerio might be combined with a time-varying source distribution to achieve the same final processing profile. The actual motion scenario and/or time varying processing rates used during a given process are determined by the corresponding uniformity requirements.

The above premise is implemented in one illustrative embodiment of the invention using a horizontal flat-plate planetary substrate fixture as shown in FIG. 2 (side view) and FIG. 3 (plan view). This planetary has two degrees of freedom: spin rotation of the individual substrate carriers about their centers, as indicated by the arrow A in FIG. 3, and orbital rotation of the main plate holding these carriers about its center, as indicated by arrow B. This means that the center of any substrate carrier can be positioned at any point on its orbit beneath a given source, as shown in FIGS. 2 and 3. For any given orbital position, the spin of the substrate carriers ensures circularly symmetric processing about the center of the substrate carrier. Depending on the horizontal distance between the center of the source and the center of the substrate carrier, a wide and continuous range of spin-averaged substrate processing profiles can be generated. Four specific examples of equal-time processing profiles as a function of center-to-center horizontal distance are shown in FIG. 4 for the actual case of a quartz deposition from an RF magnetron source. Note that when the center-to-center distance is zero, the carrier is centered under the source, and the substrate deposition profile is the source distribution profile discussed above (e.g., FIG. 1). By varying this distance as a nonlinear function of time, a weighted superposition of processing profiles on the substrate is obtained. FIG. 5 is an example of how a weighted superposition can be used to achieve >99% thickness uniformity over a 4-inch diameter substrate, even though the source distribution is highly nonuniform over the same area.

It is important to note that this particular example of a motion scenerio is just one of many possible motion scenarios capable of achieving essentially equivalent thickness uniformity over the same substrate area. It is a feature of the invention that one can choose the best motion scenario for optimizing both processing homogeneity and processing thickness uniformity simultaneously. For instance, a high-speed continuous motion scan is preferred over the stop-and spin scan illustrated in FIG. 5, when deposition homogeneity is a primary consideration (e.g., during reactive depositions). In practice, this requirement must be traded off against the mechanical limitations of the particular scanner system employed.

It should also be noted that in this particular illustrative embodiment of the invention it is assumed that the processing is isotropic (nondirectional), which is typical of sputtering sources. When directionality of the source becomes a factor, such as with ion- or electron-beam sources, uniformity in all processing properties is still obtained as described above whenever the beam from the source is normal with respect to the substrate surface, or even when the beam is not normal if the surface of the substrate is insensitive to the directionality of the beam with respect thereto. Depending on the orientation of grooves, step edges, etc. on the surface of the substrate, the surface may be sensitive to such directionality. If so, a further degree of motion of the substrate with respect to the source must be added, such as radial movement of an orbiting planetary, in order to achieve totally uniform processing. Although more complicated mechanically, a scanner with three degrees of freedom is fully consistent with the hardware approach, operating principles, and high uniformity processing of this invention.

In summary, in the present invention it has been demonstrated both theoretically and experimentally that non-linear motion scenarios of a substrate with respect to a source can be used to produce extremely uniform processing in both thickness and homogeneity over substrate areas of arbitrary size from both directional and nondirectional sources of all types, even when the source distributions are highly nonuniform on the scale of interest.

In spite of this demonstrated capability for producing extremely uniform processing from highly nonuniform source distributions, the commercial usefulness of this processing technique depends upon whether it can also be implemented in a manner consistent with reasonable throughput and efficiency expectations for this type of equipment. The following are brief description of certain key elements of the invention which may be employed to provide reasonable throughput and efficiency, in addition to unprecedented high performance.

a. In-situ Mobile Source Processing Monitor

Precise knowledge of the source distribution is required in order to predict the non-linear motion scenario that is required to achieve processing of specified uniformity over a specified area. Because of changes in source operating conditions and/or characteristics (e.g., amount of target erosion), the source distribution may vary significantly from run to run. Conventional techniques for calibrating (measuring the amplitude and shape) of source distributions, such as stylus measurements of step heights on test substrates, are not in situ and are tedious and time consuming. Commercial quartz crystal real-time deposition monitors are in-situ devices, but must be operated as fixed-point (stationary) monitors because of cumbersome electrical and/or water-cooling interfaces. In the present invention, a commercially available quartz crystal monitor has been custom modified for mobile operation and incorporated directly onto the scanner. Custom-designed control electronics for this monitor provide an efficient interface for optionally computer controlled amplitude and shape calibration of any source (except heaters, which require a separate mobile thermal processing monitor) just prior to substrate processing. This quick (<1 minute) and accurate way of updating the source distribution in a timely manner is an important feature in its own right, especially compared to the current alternatives which are not in situ and take hours to generate equivalent information. The monitor of the present invention is equally effective in measuring etch rates and profiles generated by a collimated ion-beam source. This feature alone provides the capability of efficiently combining in one system the full capabilities of different sources as indicated in FIG. 2 that traditionally have been kept separated. In addition to the obvious cost savings, this combination of capabilities in one system opens the door to certain kinds of substrate processing that were previously unattainable. Note that in measuring etch rates as opposed to deposition rates, the quartz crystal sensor must be precoated with the material of interest. The availability of a variety of deposition sources in the same vacuum system with the ion-beam etching source makes this precoating requirement both simple and quick, and the corresponding etch rate measurements are very accurate. This is to be contrasted with the traditional method of characterizing ion-beam sources that uses a Faraday cup to measure the ion-beam current. This method is clearly less satisfactory because the ion-beam current is only indirectly related to the actual etch rates of the various materials of interest, and is insensitive to the presence of high-energy neutral atoms that also contribute to the etch rate. However, a mobile Faraday cup ion-beam current monitor has also been incorporated into the present invention because of its complementary measurement capabilities. The importance of this mobile in-situ quartz monitor to the efficiency of the present invention cannot be overstated. Although it is often possible to implement the processing technique of this invention without relying heavily on this in-situ monitor (e.g., some pure metal sources have fairly constant deposition profiles), its presence vastly enhances efficiency and simplifies operations even for these special cases. For processing where the source distributions often vary substantially from run to run (e.g., reactive sputtering or ion-beam milling), the presence of this in-situ monitor is indispensable to achieving useful commercial throughputs using this processing technique. In addition, the existence of this monitor in a multi-source system enormously simplifies establishing the absolute deposition rates of the various sources, which typically must be frequently updated. Although a quartz crystal monitor is not an absolute processing monitor because its response varies as a function of crystal life, its relative response to processing from different sources is not a function of crystal life, at least to first order. Given that the relative crystal response of the mobile monitor to processing from all the different sources of interest has been measured once, measuring the absolute processing rate of just one source provides an absolute calibration update of the quartz monitor for all sources. This is to be constrasted with the traditional approach of using dedicated fixed point quartz monitors for each source, where the relative response to different source processing is irrelevant, and absolute deposition rate updates must be carried out for each monitor-source pair. Finally, it is clear that this particular aspect of the invention has considerable stand-alone significance. The need for a quick and accurate method of measuring the shape and amplitude of source distributions in situ is a universal need throughout the PVD equipment industry. A stand-alone unit consisting of a quartz monitor, scanning mechanism, vacuum feedthroughs, readout electronics, and dedicated computer controller and data acquisition system is thus a futher important aspect of this invention.

b. Process Control

The in-situ processing monitor carries out the source calibration just prior to, rather than during, the substrate processing. This is necessary because usefully placed real-time processing monitors significantly obstruct the source distribution, especially when the substrates are of a size comparable to or larger than the source distribution. Therefore, the effectiveness of the processing technique of this invention depends directly on how similar the source distribution is during substrate processing to what it was during calibration. To achieve this required similarity, at a minimum the total processing environment must be precisely and reproducibly controlled thoughout the entire processing procedure. A controlled processing environment is a necessity for the useful operation of any PVD system. However, since this invention offers substantial improvements over the prior state of the art in processing uniformity, the necessity for corresponding improvements in the control of the processing environment are to be expected. In this invention no new technology has been introduced for achieving enhanced process control. Rather, considerable care and attention to detail has been exercised in the choice and operation of commercially available pressure and source controllers. The one possible exception is the use of a custom-designed passively-controlled high-purity gas feed system, which provides an ideal combination of performance, versatility, and reliability within the context of the current implementation of the invention.

c. Precision Scanner

A precision motion mechanism is required for quickly, accurately, and reproducibly positioning the substrates and mobile source monitors relative to any given source distribution in order to successfully implement the invention. The more rapid the motion of this mechanism, the higher the quality of processing in every respect (e.g., deposition homogeneity and substrate throughput). The current implementation is a planetary system with two independent degrees of freedom (orbit and spin) with reproducible orbital positioning accuracy better than 0.010-inches. This is a higher performance version (e.g., higher precision bearings, higher tolerance parts) of conventional flat-plate planetary fixtures that are commercially available, and is just one possible implementation of any number of possible motion mechanisms for changing the source-substrate relative postitioning (including moving the source). In any case, for any given process, the required positioning accuracy depends on the specified uniformity requirements.

d. Computer Control, Data Acquistion and Analysis

The computation time involved in calculating the scanner motion required to achieve processing of any specified uniformity over any specified area from any given source distribution is formidable. Only with the advent of the most recent generation of portable instrument control computers has it been possible to meet such a requirement in a practical way on the time scale of interest. A second feature of these high-speed computers is enhanced processing reliability. A problem with any computer-controlled process operating in an industrial environment is electrical-noise induced processing errors. Processing reliability is of particular importance in this invention, where errors in the sophisticated and high-speed planetary motion might easily go unnoticed, even by a perceptive observer. A high-speed computer provides the luxury of at least double-checking most commands before proceding.

e. Efficient, Mobile, Front-side Heater

A mobile radiative heater is important to the overall success of thin film processing systems of the present invention, since in many applications there is a need to heat substrates under vacuum over a wide temperature range (100°-600° C.) just prior to or during the processing of thin films. The present invention incorporates a front-side radiative heater of uniquely high mobility that permits the uninhibited operation of the rest of the system without asking the user to do without a real-time heater. The keys to this aspect of the invention are the use of material with a strong temperature coefficient of resistance for the heating element and the mounting of the heater onto the rotary shutter (FIG. 2). A strong temperature coefficient makes it possible to simultaneously use the heating element as the sensor for monitoring the heater temperature. In addition, by using a constant-voltage, current-limited power supply as the source controller for positive coefficient heating elements (vice-versa for negative coefficient heating elements), a significant degree of temperature regulation is also achieved. Thus, only one high-vacuum electrically-insulated feedthrough is required to power, monitor, and regulate this implementation of a radiative heater, which may be a thick-film platinum resistor patterned onto an insulating ceramic substrate. It is this aspect of the heater design that makes possible its phenomenal mobility within a high-vaccum chamber. In the present invention there is the capability for rapidly oscillating the substrate carriers between any two sources, so that heating during processing can be readily achieved in this manner, where the heat source is preferably adjacent to the processing source of simultaneous interest. Since the system may have five or more processing sources, a highly mobile heater is required in order to satisfy the processing requirement that the heater be adjacent to the processing source of interest whenever sequential preheating or heating during the processing is required. This is accomplished by mounting the heater on the rotary shutter, and using a sliding electrical contact positioned on the axis of rotation of the shutter as the electrical interface between the heater and its power supply. Finally, the mobile front-side radiative heater as implemented in this invention is extremely efficient, in that most of its energy couples directly into the substrate and not to the surroundings. This is in direct contrast with most commerically available radiative heater implementations (e.g., quartz-tube radiative heaters), where coupling efficiencies are often so low that the maximum allowable substrate temperatures are dictated by the temperature limitations of the surroundings.

f. Mobile Substrate Carrier Heat Sinks

In many applications there is a need to heat sink the substrates in order to stabilize the processing temperatures. The conventional approach of using water-cooled the substrate carrier is incompatible with the current implementation of this invention where the substrates must be extremely mobile. Various phase-change materials with high heats of transformation have been incorporated into the substrate carriers of the present invention in order to provide a wide range of stable processing temperatures without restricting carrier mobility. For example, calcium chloride hexahydrate sealed into an aluminum or stainless steel substrate carrier provides an effective 27° C. mobile substrate heat sink for use in this invention.

The significance of the processing techniques of the present invention are summarized below:

a. High quality thin film processing with uniformities exceeding 99% are now possible without significant compromises in throughput. Relevant applications for this unprecedented uniformity include the fabrication of optical and magnetic memory disk storage media, active and passive semiconductor devices (particularly on large monolithic circuits), and passive electrical components for hybrid integrated circuits. Device reproducibility resulting from very uniform processing over large substrate areas improves yield and can eliminate the need for time consuming and expensive trimming operations that are currently often required. Similarly, compositional uniformity is a key requirement in the production of reproducible and stable thin-film resistors. Although not as common a processing requirement, the prescribed nonuniformity capability of this invention is also quite significant. An example of an application where a thin-film processing of specified nonuniformity would be useful is in the fabrication of spatially-varying optical elements, such as apodizing filters.

b. A wide variety of small, high-performance PVD sources can be combined on the same PVD system to provide unprecendented versatility and capability within the same system. Since the source distributions may be continuously updated, the type and design of the sources are not critical and extremely high target utilization is routinely achieved. Relevant applications for the simultaneous use of different types of sources on PVD systems includes planarization of coatings on highly structured substrate surfaces by combining the step-coverage properties of magnetron sputtering with the highly directional etching properties of a variable angle-of-incidence ion-beam source focused onto a rotating substrate. Similarly, the ion-beam source may be used to carry out dry-etch pattern delineation on hygroscopic materials, which may then be hermetically sealed without breaking vacuum with a conformal sputtered thin-film protective layer.

c. R&D activities can be carried out with great efficiency, and then scaled up to production-size substrates (up to 8-inches in diameter in the current configuration) without changirg sources or fixturing. This is because the areas of high-uniformity processing can be tailored to match the substrate size and uniformity requirements of any give processing task simply by programming the computer accordingly. In this way, the approach of the present invention can be used to efficiently and painlessly bridge the gap between initial fabrication of one-of-a-kind R&D devices and the production of the same devices at useful commercial throughputs.

Other advantages and applications of this invention will be apparent from a reading of the following specification and claims taken with the drawings.

BRIEF DESCRIPTION OF THE DRAWINGS

FIG. 8 is a cross-sectional view of an illustrative phase-change substrate carrier in accordance with the invention.

FIG. 10 is a diagrammatic illustration of an illustrative mounting of a crossed-beam fixture for simultaneous secondary-ion deposition and ion-beam scrubbing on an orbiting and/or spinning substrate.

FIG. 11 is a plan view of an illustrative rotary shutter including the heater of FIG. 12.

FIG. 13 is a flow chart of an illustrative overall operation of the system of FIGS. 6 and 7.

DETAILED DESCRIPTION OF A PREFERRED EMBODIMENT OF THE INVENTION

Figure 1:
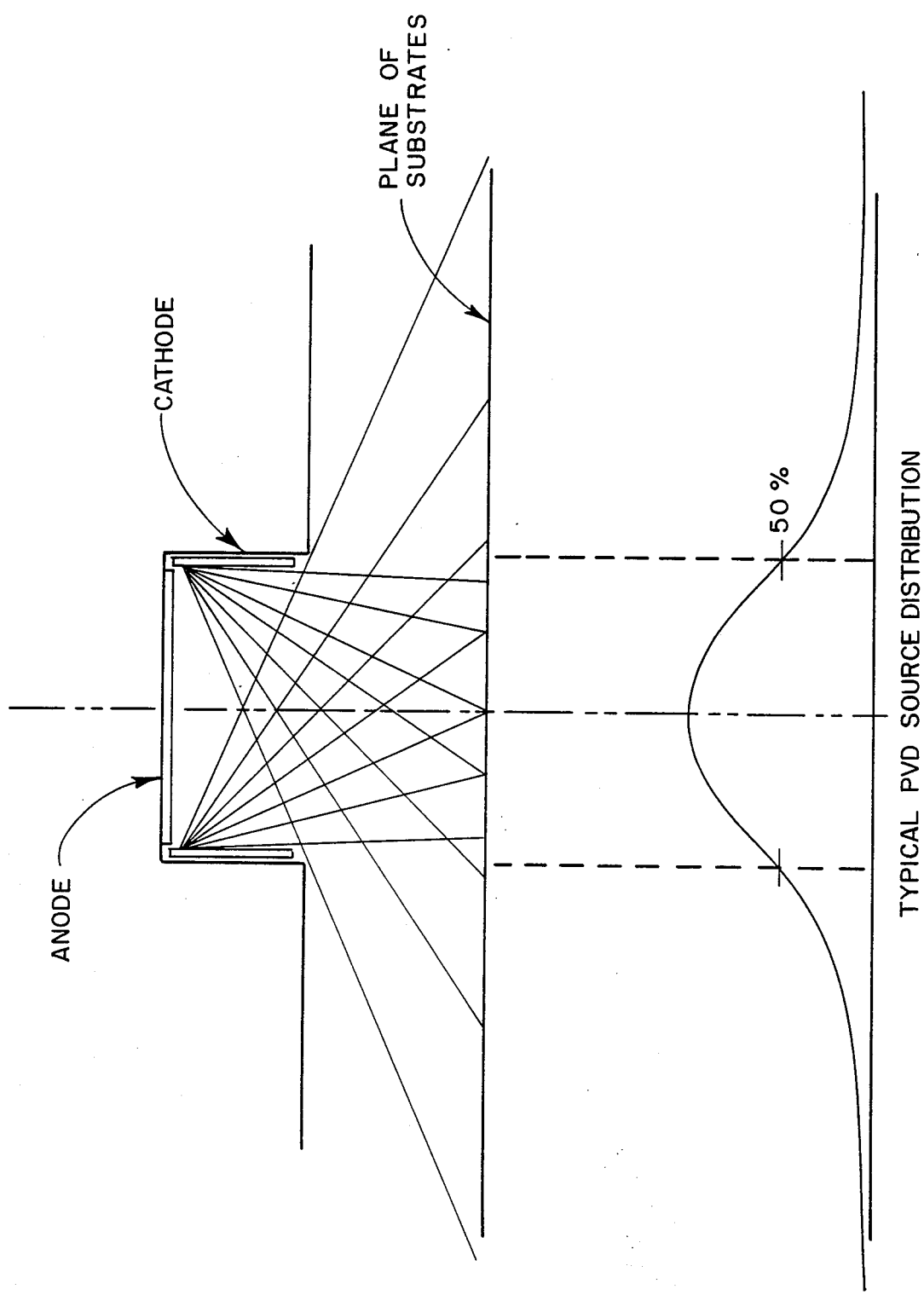
FIG. 1 is a schematic diagram of a typical PVD source illustrating the deposition profile thereof.

Reference should be made to the drawing where like reference numerals refer to like parts.

Figure 6:
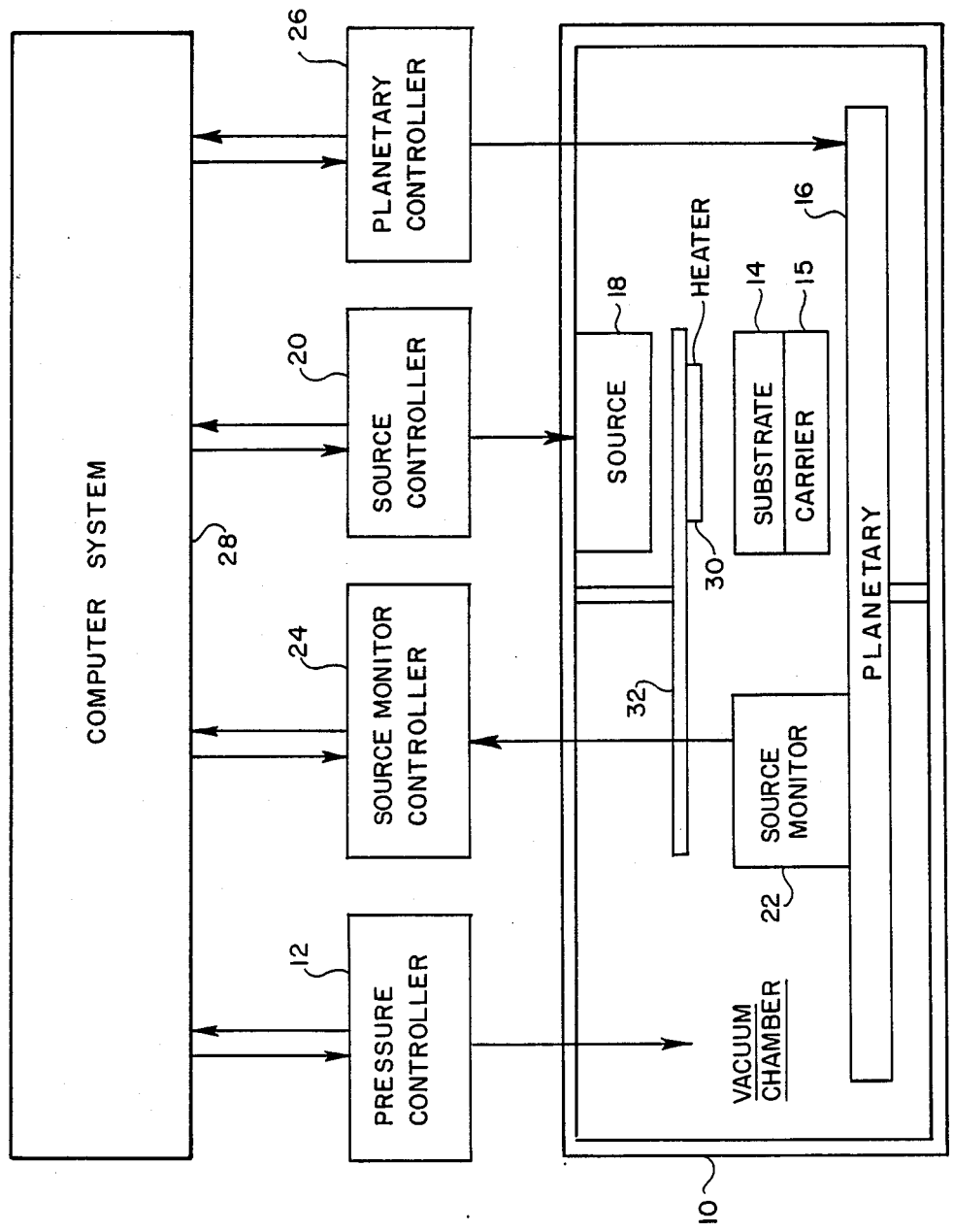
FIG. 6 is a functional hardware block diagram of an overall illustrative system in accordance with the invention.

FIG. 6 is a high-level block diagram of the basic component hardware of the invention. The hardware block diagram shown in FIG. 6 is high-level in the sense that each block represents a functional hardware subsystem. Each hardware subsystem is typically composed of several separate hardware components that operate synergistically, as will be further described below with respect to FIG. 7.

Figure 7:
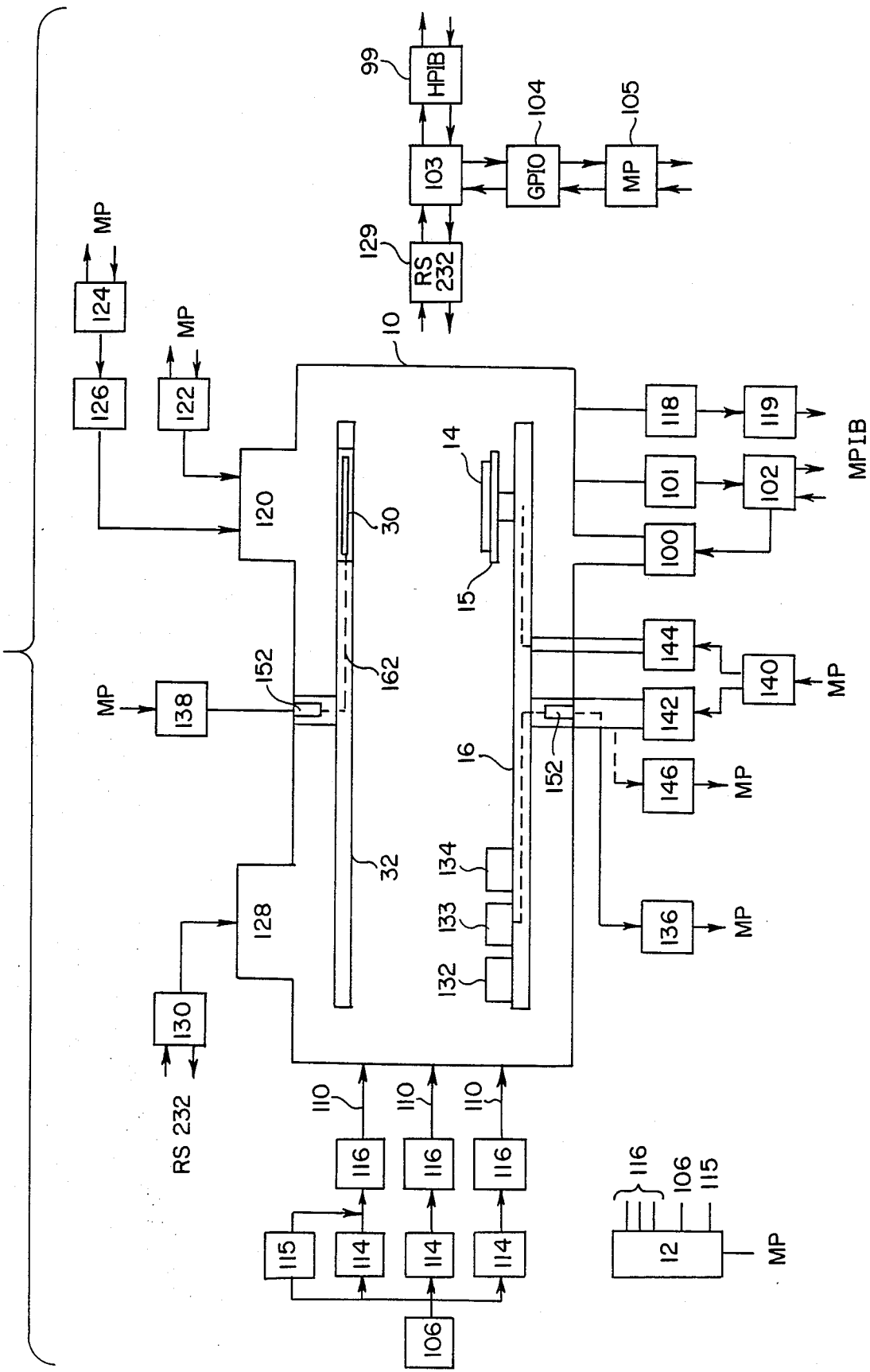
FIG. 7 is a component hardware block diagram of an illustrative embodiment of the overall system of FIG. 6.

In general, the system of FIGS. 6 and 7 include a vacuum deposition subsystem, which is required to provide a stable and controlled environment for the reproducible fabrication of thin film structures and devices. This vacuum subsystem consists of a vacuum deposition chamber 10 and includes all the pumps, valves, and feedthroughs 100 (FIG. 7) required to produce a low background pressure ($<1E-7$ Torr) in the chamber, such accessories being known to those skilled in this art. Vacuum subsystems suitable for implementing the present invention are commercially available from a variety of different vendors (e.g., Varian Associates, Torr-Vacuum Products) in either component or assembled form, as desired.

Figure 2:
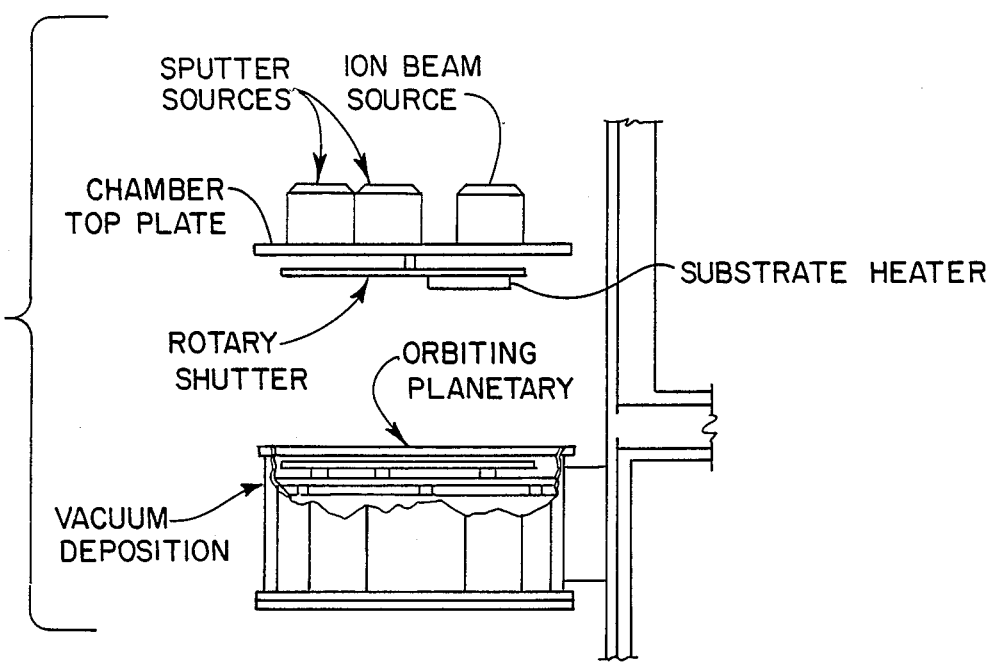
FIG. 2 is a diagrammatic side view of an illustrative PUD system in accordance with the invention.

The system also includes a pressure controller subsystem 12 (FIG. 6), which consists of all those components (e.g., control valves, gas feed systems, pressure sensors, etc.) necessary to stably and reproducibly set, measure, and control the gas background in the vacuum chamber during processing. A suitable active feedback controller subsystem of this type is commercially available from MKS Instruments Corporation. However, in the present invention where many different types of sources may be employed simultaneously, it is usually necessary to introduce and control mixtures of several different high purity gases over a very wide range of pressures. Since most commercially available active pressure controllers are narrow range devices, several of them would therefore be required. In this instance, the system may preferably employ a custom-designed passive pressure controller, there being provided at least one or more (three are preferred) regulated supply channels of inert and/or reactive gas 106 (FIG. 7), where each of these channels has typically three separate feeds 110 to vacuum chamber 10, the three feeds typically being respectively associated with the various types of sources which may be individually or jointly used in the system. These sources are typically one or more DC and/or RF sputter sources, one or more ion-beam sources, a heat source, and one or more auxiliary sources such as an evaporation source, etc. (FIG. 2). Each of these sources typically requires different pressure levels in the chamber and thus each feed line includes a needle valve 114 for pressure adjustment over a range of typically $1E-1$ to $1E-6$ Torr. Each feed also includes a on-off solenoid valve 116 for feed line selection and chamber isolation. Another solenoid valve 115 may be employed for purging the channel between feed selections. All solenoid valve operations are remotely programmable via the multiprogrammer computer interface 105 discussed below. Measurements of the chamber pressure may be effected with a complementary combination of pressure gauges 101 and 118 and corresponding control electronics 102 and 119, as shown in FIG. 7, such as MKS model 390 absolute capacitance manometer and model 270B controller, and Granville-Phillips model UPC-303 ion and thermocouple gauge pressure measurement system. Note that the Granville-Phillips model UPC-303 also serves as the automatic controllers 102 for the pumps and valves 100 of the vacuum subsystem 10.

Figure 3:
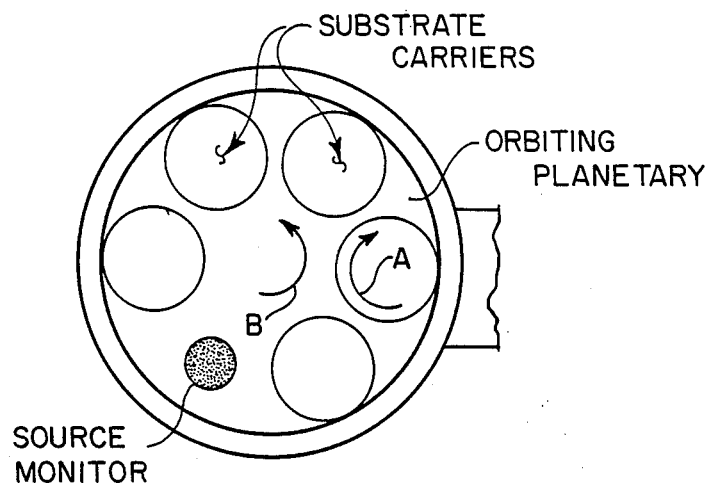
FIG. 3 is a plan view of the orbiting planetary substrate fixture of FIG. 2.

The orbiting planetary substrate fixture 16 is a precision in-situ motion mechanism which quickly, accurately, and reproducibly positions the substrates and mobile source monitors relative to any given source distribution in order to successfully implement the present invention. This planetary may comprise a horizontal, 24-inch nominal diameter, flat plate planetary with independent orbit and spin motions of up to ten 4.5-inch diameter planets (substrate carriers), as shown in FIGS. 2 and 3. Electrically isolated substrate carriers provide for DC/RF bias and etch capability. Easily adjustable source-to-substrate distance accommodates substrates over 1-inch thick, and allows for custom-designed substrate carriers, such as the phase-change carriers described below. Such a planetary is commercially available (e.g., Torr-Vacuum Products), although an upgraded version that utilizes precision bearings and higher tolerance components is preferred for the present invention.

One or more substrate carriers 15 are provided on the orbiting planetary substrate fixture 16, each substrate 14 being disposed on the substrate carriers 15, as shown in FIGS. 3, 6, and 7. The substrate carriers 15 may contain a high heat-of-fusion phase-change material in order to provide a stable heat sink for the substrate during processing, as required. Such an approach to heat sinking in this embodiment of the invention is preferred because the conventional approach of using water-cooled substrate carriers is incompatible with the requirement that the substrate carriers be highly mobile. Any number of phase-change materials with a wide range of transition temperatures might be used, including metals, alloys, and organic and inorganic compounds. For this application, the final choice is dictated primarily by considerations of transition temperatures; heat of fusion per unit volume; safety in handling, containment, and operation; and stability and reliability in phase-change properties (e.g., minimal supercooling and/or superheating effects). Based on these considerations, the phase-change material may be any one of a variety of salt hydrates, including calcium, sodium, and magnesium. One specific implementation may be calcium chloride hexahydrate 148 (containing nucleators to suppress supercooling) sealed in a stainless steel or aluminum enclosure 150 with a machined interior 149 to improve the thermal conductivity between the phase-change material and its enclosure, as shown in FIG. 8. Calcium chloride hexahydrate has a 27° C. melting point, 1.6 specific gravity, and 46 calories per gram heat of fusion. These properties make it ideally suited for providing a mobile, compact, lightweight, stable, reliable, and effective low temperature heat sink for even high power processing. For instance, 500 grams of this material sealed in a 4.5-inch diameter by 1.5-inch high aluminum container weighs less than 750 grams total, but will absorb over 20 watts continous power input for up to one hour without completing its phase change at 27° C.

Rotary shutter 32 (FIG. 7) may comprise a 22-inch diameter electropolished stainless steel plate internally suspended from a central clutch bearing (not shown). Planetary orbital motion may be used to position the shutter, thus eliminating the need for a separate actuator, position indicator, computer interface, and high-vacuum rotary feedthrough. The shutter provides additional substrate protection from particulate contamination, serves as the carrier for the mobile front-side radiative substrate heater, and may be used to select individual substrates for DC/RF bias/etch sputtering. Shutters of this general type (using external actuators) are commercially available from Torr-Vacuum Products.

Planetary controllers 26 (FIG. 6) provides the means for accurately setting planetary position and/or controlling planetary speed and direction at any given time. It also provides real-time monitoring of these parameters directly to the computer system 28 (FIG. 6). Thus, an unlimited number of planetary motion scenarios are at the user's disposal through the computer software. The controller may be a programmable dual channel power supply 140 (e.g., Hewlett-Packard model 6205C) which controls two reversible variable speed motors 142 and 144 used to independently drive the orbit and spin motions, respectively, as shown in FIG. 7. Orbital position may be precisely monitored with an absolute position optical shaft encoder 146 (e.g., BEI series M-25). Front panel switches and status indicators also allow complete manual control, if desired.

The computer system 28 (FIG. 6) is the nerve center of the physical vapor deposition system of the present invention. Although manual overrides are available and the computer system need not be used, in practice it is almost indispensible for all but the simplest processing. It consists of all the software and the computer related hardware and interfaces necessary to set, control, monitor, and document the rest of the system hardware. This includes the user interface (keyboard and/or touch-screen), central processing unit, disk mass storage, CRT monitor, printer, and various control and data acquisition interfaces (e.g., HPIB, GPIO, RS-232, multiprogrammer) necessary to communicate with the assorted programmable hardware components that comprise much of the remainder of the PVD system. The computer of the system may be a Hewlett-Packard 9000 model 310, which is a bundled measurement automation system consisting of: 98561A SPU; 35731A CRT monitor; 46020A keyboard; Basic 5.0; 1 Mbyte RAM; HPIB, GPIO, RS-232, and HP-HIL; touch-screen bezel; and battery-backed real-time clock. The disk drive may be a Hewlett-Packard model 9153A, which combines the storage (10 Mbyte) and speed of a hard disk with the backup and interchange capabilities of 3½-inch microfloppies (780 Kbyte) into a single compact package. The printer may be a 150 cps Hewlett-Packard model 2225A. The multiprogrammer may be a Hewlett-Packard model 6940B, which provides the various required A/D and D/A interfaces, as well as an expandable card-cage design that makes it suitable for a wide range of high-speed automatic test, data acquisition, and control applications, as needed.

Figure 9:
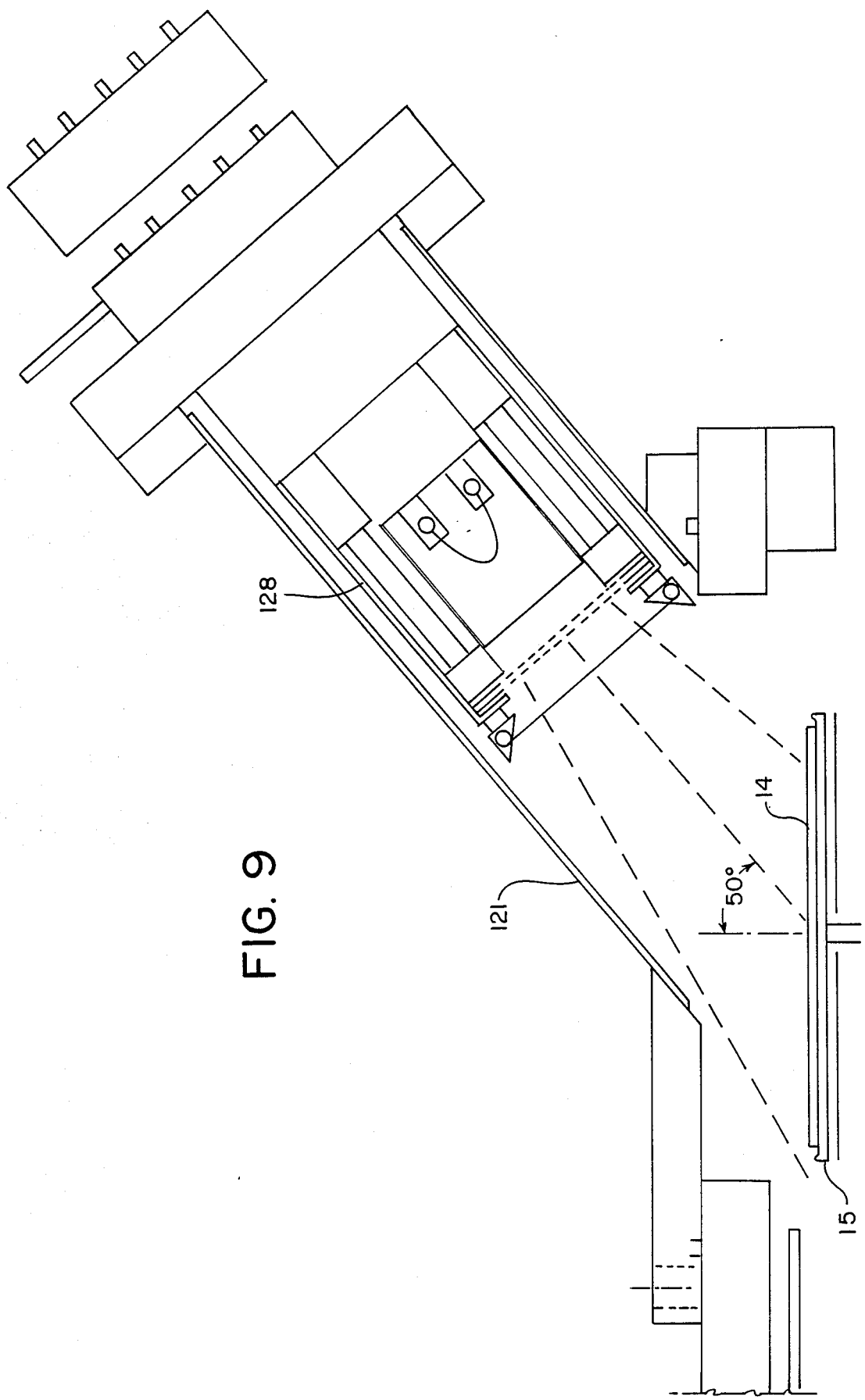
FIG. 9 is a diagrammatic illustration of an illustrative mounting of an ion-beam source inclined at an angle with respect to the axis of rotation of a spinning substrate carrier.

As stated above, the source(s) 18 (FIG. 6) may be any of a number of different types of sources such as DC/RF magnetron, diode, and triode sputtering sources; resistive and E-beam thermal evaporation sources; ion-beam milling and secondary-ion deposition sources; and radiative heater sources; where, in the present preferred embodiment, the sources are shown mounted either on the top plate of the vacuum deposition chamber or on the rotary shutter (FIG. 2). This deposit-down configuration is an arbitrary choice with respect to the implementation of the invention, and most other configurations, including deposit-up and side-deposit, are equally acceptable in this regard. The primary requirement on each source for the successful implementation of the processing technique of the present invention is that the source distribution be sufficiently stable and independent of the properties of the substrate that its processing properties can be fully characterized or predicted from the shape and amplitude of this destribution. Even if the substrate properties influence the processing properties of the source, it is often still possible to systematically predict and/or experimentally measure these interactions and to make the appropriate and compensating corrections to the processing parameters. For example, the effect of substrate temperature on deposition rate can be dealt with easily. Each source (except for the heater) is hermetically secured in a known manner to one of the ports in the top plate of the vacuum chamber, as shown in FIG. 2. A specific DC/RF sputtering source 120 (FIG. 7) which may be employed is Sputtered Films Inc. model PSG-3. The corresponding DC power supply 122 may be Sputtered Films Inc. model 600-4.5. The corresponding RF power supply 124 and matching network 126 may be RF Plasma Products models RF-10 and AM-10, respectively. As an on source 128, Ion Tech model 3-1500-250 may be employed, using Ion Tech model MPS-3000FC as the corresponding power supply 130. Fixtures 121 at user specified angles of incidence ranging from 0 to 50 degrees relative to the axis of rotation of the spinning substrates 15 may be provided, as shown in FIG. 9. The processing chamber may also accept a second ion gun, either in a fifth top-plate port or on an optional crossed-beam fixture 123 designed for ion-beam scrubbing of substrates during secondary-ion deposition, as shown in FIG. 10, where the secondary-ion deposition is effected by ion-beam bombarding a source material 193 onto a substrate 14.

Figure 12:
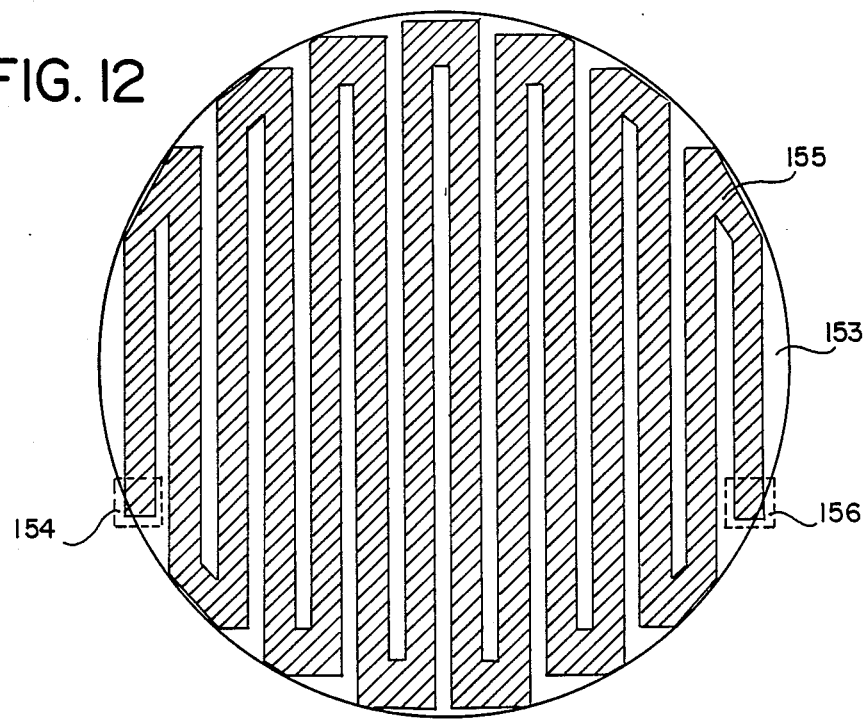
FIG. 12 is a plan view of an illustrative substrate heater in accordance with the invention.

A front-side radiative heater 30 may be mounted on a planetary shutter 32 to permit mobile front-side heating of substrates prior to and/or during subsequent processing (FIG. 7). A plan view of a rotary shutter 32 is shown in FIG. 11, where the heater 30 may be positioned adjacent to the open portion 158 of the shutter. Since the open portion of the shutter is always aligned with the current processing source 18 (FIG. 6), this configuration assures that the heater is always adjacent to the source of current interest, and thus, that sequential heating of substrates prior to or during the processing is easily implemented, as discussed above. A slot 160 (FIG. 11) may be provided in the shutter 32 through which a single insulated electrical lead 162 connects the heater 30 with a sliding contact electrical connector 152 (FIG. 7) that may be similar to the ones used for the mobile deposition monitors discussed below. Only one insulated lead is required if the heater has a large temperature coefficient of resistance, since in this instance the heater may be simultaneously operated as the heating element, temperature sensor, and temperature controller, as discussed above. The heating element may comprise a nominal 10 ohm thick-film platinum resistance radiative heater 155 which is silk-screened patterned and then fired at $>1100°$ C. onto one side of a 4.5-inch diameter by 0.04-inch thick alumina or BeO ceramic substrate 153, as shown in FIG. 12. An insulating overglaze may be coated over the entire heater pattern (except for the live contact pad 154 and the ground contact pad 156) and then fired at $>900°$ C. Heater temperatures over 600° C. at supply powers (100 watts may be achieved with $+/-1\%$ reproducibility. An appropriate constant-voltage, current-limited power supply 138(FIG. 7) may be a Kepco model JQE 55-2M.

The remotely programmable source power supplies 122, 124, 130, and 138 of FIG. 7 are included in the source controller 20 of FIG. 6. By "remotely programmable" is meant that, with a suitable control and/or data acquisition interface to the computer 103, the programmable device can be remotely operated by the computer. Suitable interfaces for effecting communications between the computer and the power supplies, as well as with all of the other programmable components and subsystems of the invention (e.g., the vacuum and pressure controllers) may include standard GPIO, HPIB, and RS-232 interfaces (104, 99, and 129, respectively, in FIG. 7) and a multiprogrammer 105 that may contain various A/D and D/A convertors for controlling and/or monitoring several processes at once. Alternatively, local programming may be selectively employed at the user's disgression to achieve controlled operation at the component or subsystem level. Generally, source controller 20 (FIG. 6) includes a combination of remotely and/or locally programmable power supplies and feedback monitors necessary to set and control the electrical parameters applied to a given source during the processing. For example, in DC supply 122 (FIG. 7), the current delivered to the source is internally controlled by a feedback loop to thus control the amplitude (rate) of the source distribution. Therefore, the effectiveness of these control techniques in achieving uniform depositions depends strongly upon the reproducibility and stability of the processing environment, as discussed above.

Mobile source processing monitors 22 are provided on the orbiting planetary substrate fixture 16 (FIG. 6). These monitors are used in calibrating (establishing the amplitude and shape) the various sources 18, as needed, just prior to substrate processing. These monitors may include a thermal deposition monitor 134, an ion-beam current deposition monitor 132, and a mass-sensitive deposition monitor 133, as shown in FIG. 7. The primary requirements on these monitors are that they be in situ, real-time, and mobile; and that they provide sufficiently accurate calibration information on the various source distributions that it is possible to achieve the desired levels of substrate processing uniformity. The thermal deposition monitor may comprise a resistance thermometer (e.g., a thick-film platinum resistance thermometer on a 1-inch square ceramic substrate commercially available from Johnson Matthey Inc.) or a thermocouple (e.g., a stainless-steel-sheathed type-K thermocouple available from Omega Engineering attached to a 1-inch diameter by 0.005-inch thick stainless steel sensor plate). The ion-beam current monitor may comprise a Faraday cup. The mass-sensitive monitor may comprise a quartz crystal sensor, such as Inficon model 007-215, with appropriate modifications to its thermal and electrical interfaces in order to improve mobility, as described below. Each of these monitors preferably utilizes a sliding contact electrical interface 152 (FIG. 7) between moving and non-moving portions to allow for maximum mobility. A suitable in-situ coaxial sliding electrical contact may be obtained from Suhner (e.g., subminiature bayonet connector model SMS). Alternatively, a rotating electrical feedthrough may be utilized and the sliding electrical contacts implemented external to the vacuum chamber in a manner known to those skilled in this art. The quartz crystal monitor also requires a thermal interface to maintain its operating temperature between 0° and 50° C. for highest reliability operation. Commercially available quartz crystal monitors are designed to operate as fixed-point sensors, and utilize cumbersome water cooling lines to satisfy this thermal interface requirement. In the present embodiment of this invention the need for water lines has been eliminated by providing a strong thermal link between the quartz crystal monitor 133 and the massive, and therefore high heat capacity, orbiting planetary substrate fixture 16 (FIG. 7). The overall temperature rise of the combined monitor-planetary thermal system is miniscule on the scale of interest, particularly since the quartz crystal monitor is typically used intermittently in the present invention, rather than continuously as in most fixed-point applications. The means for achieving an effective thermal link involves the straightforward use of thermal gaskets and straps, and is well known to those skilled in this art. At very high deposition rates (e.g., ion-beam milling), masks that stop down the crystal field of view of the source may be used to further ensure acceptable operating temperatures, since at high deposition rates the reduced sensitivity of a stopped-down quartz crystal monitor is insignificant.

Source monitor controllers 24 (FIG. 6) are commercially available for each of the above processing monitors (e.g., Omega Engineering thermocouple controller model 402B. Ion Tech power supply and ion-beam current monitor controller model MPS-3000FC, and Inficon quartz crystal controller model XTC). However, commercially available quartz crystal monitor controllers are designed for conventional fixed-point operation and are not well-designed for mobile applications. For instance, the loss of a single data point during calibration in the present invention is much more serious than for fixed-point monitoring. On the other hand, many of the design features of the commercial units (e.g., soak times, set points, rate ramps, etc.) are of no use in mobile applications. Therefore, a preferred embodiment for the present invention is a custom quartz crystal controller that is designed for mobile calibrations and rapid computer data analysis of calibration data. Specifically, a controller with these properties that takes direct advantage of the powerful control computer may be efficiently implemented by utilizing in an appropriate manner the standard pulse counting, time and frequency reference, and breadboard cards available with the Hewlett-Packard multiprogrammer model 6940B. The output of this controller is simply the mass-dependent quartz crystal resonant frequency. Therefore, the efficient operation of this quartz crystal controller in the present invention is primarily a result of developing and implementing the corresponding control software to interpret changes in this resonant frequency in terms of the calibration parameters of interest, as described below. Using the powerful system control computer directly for acquisition and analysis of the quartz crystal monitor raw data offers special advantages relative to commercial controllers, including programming options to distinguish "good" from "bad" data points, take special averages, store and compare data, perform interpolations and curve fittings, etc.

FIG. 13 is a functional flow diagram of the processing technique of the present invention where the program is executed by computer system 28 (FIG. 6). For symbolic clarity, operator inputs are ellipses, operator decisions are diamonds, and computer-controlled hardware/software operations are rectangles. The following are explanations of each of these components within the context of this flow diagram.

Operator Inputs

The required operator inputs for any given processing task are limited to specifying at the appropriate points in this flow diagram just a few major process parameters; namely:
a. Source type and position (ellipse 34);
b. Planetary mode (ellipse 36);
c. Processing area and uniformity (ellipse 38);
d. Substrate positions on the planetary (ellipse 40); and
e. Processing rate and thickness (ellipse 42).

Figure 14:
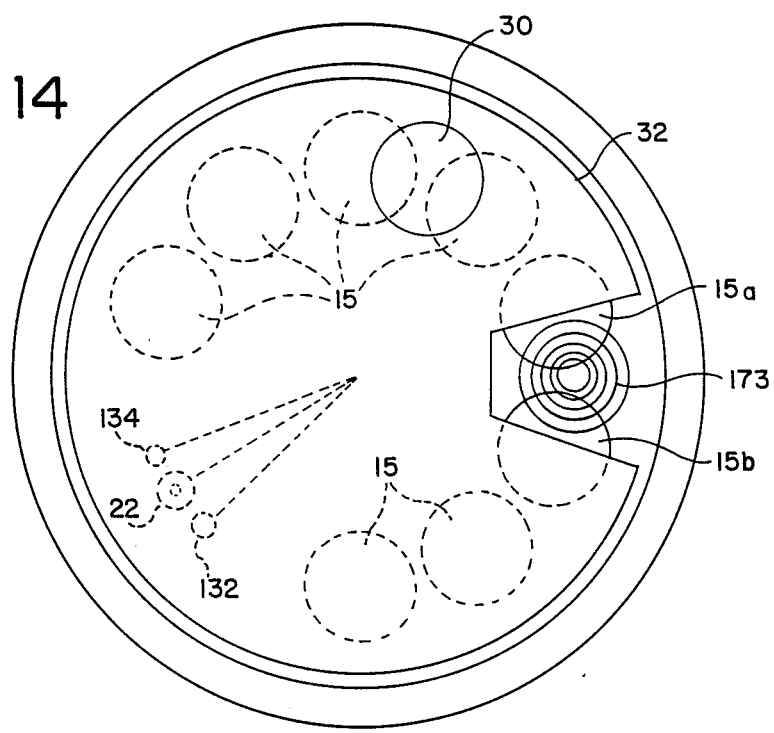
FIG. 14 is a plan view of an illustrative dual substrate (pair) processing in accordance with the invention.

The preferred embodiment of the invention offers several planetary mode processing options, including continuous, sequential, pair, and two-source processing planetary modes. A pair processing mode is illustrated in FIG. 14 by a plan view of the shutter-planetary system, where the source distribution 173 is diagrammatically shown centered in the shutter opening 158 (FIG. 11). The pair of substrate carriers 15a and 15b are scanned non-linearly in an oscillatory fashion in front of the source to simultaneously effect uniform processing thereon.

Note that once a processing task or series of deposition tasks have been defined in the above manner, they may be stored and then repeated in the future as desired, where the only user input required at that time is to load and document the positions of the substrates on the planetary. For clarity, this particular option is not shown in the functional flow diagram of FIG. 13.

Operator Decisions

Only one operator logistic decision, as indicated at diamond 44 (FIG. 13), is required in defining the specifics of a processing task within any processing task sequence: does the source distribution need recalibration? The factors involved in deciding whether or not to recalibrate are as follows. In the preferred embodiment of the invention, the source monitor carries out the source calibration just prior to, rather than during, the substrate processing. This is because usefully placed real-time processing monitors significantly obstruct the source distribution, especially when the substrates are of a size comparable to or larger than the source distribution. Therefore, the effectiveness of the present invention in achieving a uniform substrate processing depends directly on how similar the source distribution during the processing is to what it was during calibration. To achieve the required degree of similarity in source distributions, it is essential at a minimum that the pressure and source controllers 12 and 20 (FIG. 6) precisely reproduce the same processing environment during substrate processing that was used during source calibration. In fact, the ability to precisely reproduce and maintain the total processing environment is an important feature of the present invention, where considerable care and attention to detail have been exercised in the selection and operation of the hardware components necessary to achieve this processing requirement. However, the source distribution can also depend on the state of erosion of the source material, which introduces inherent use-dependent variations of the source distribution, even when the processing environment is held constant. Therefore, the need and frequency of source recalibrations are determined at a minimum by this inherent variation of the source distribution and its effect on the specified uniformity requirements. For most applications, this use-dependent variation is extremely small within a given processing task, but can become quite significant after several runs. It is a unique feature of the present invention that total source recalibration can be quickly (<3 minutes) and efficiently carried out just prior to every processing task, if necessary, thus elminating all slowly varying (on the time scale of a given task) use-dependent changes in the source distribution as significant sources of error.

Computer-controlled Hardware/Software Operations

There are five computer-controller hardware/software operations illustrated in the functional flow diagram shown in FIG. 13. Although these operations occur automatically as needed, they can be accessed individually as required to provide the following stand-alone operations.

a. Source calibration is effected at block 50. This program controls the planetary motion, data acquisition, and data analysis necessary to establish the deposit, etch, thermal, and/or electrical shapes of each source distribution using the various/mobile source monitors. This routine also carries out the curve fitting necessary to directly and continuously relate the source peak rate (amplitude) to the respective source power supply settings, as will be further discussed below.

b. Source/planet modeling is effected at block 52. Given any source distribution and planetary configuration, this program calculates a complete set of hypothetical processing profiles as a function of source-substrate relative positioning. These processing profiles serve as the building blocks for the motion scenario optimization program defined below.

c. Motion scenario optimization is effected at block 54. For a given planetary mode, this program uses the previously calculated processing profiles to establish the optimum set of planetary motion parameters (relative positions, speeds, directions, and times) required to produce processing of specified uniformity over a specified area. Note that "uniformity" is again used here in the broadest sense to means uniformity in all properties, not just thickness. This is an important distinction, since it is often possible to achieve the same processing uniformity over a given processing area using any one of several different motion scenarios. It is the processing homogeneity requirement that is used to distinguish between these different motion scenarios.

d. Computation of processing parameters is effected at block 56. For any given motion scenario and choice of substrate positions on the planetary, this program calculates the processing parameters (absolute positions, processing times, pressure settings, power supply settings, etc.) required to achieve processing of specified thickness at a specified peak processing rate, as selected by the operator (input 42, FIG. 13).

e. Planetary/processing control and process documentation are effected at block 58. This routine provides precise and fail-safe control of planetary motion and the processing environment, as determined by the motion and processing parameters established above. It also provides real-time (CRT) documentation of all aspects of the processing during the run, including motion parameters, motion scenario status, source parameters, and total system status. A concise and comprehensive hardcopy summary is provided at the end of the run.

Each of these hardware/software operations may be combined into one completely automatic operation using the next level of software control. If desired, this next level of software control may also encompass total "one-button" computer-controller processing (i.e., computer-controlled pumpdown, process gas selection and control, source selection, power supply settings and control, etc.)

Having briefly described the computer-controlled hardware/software operations 50, 52, 54, 56, and 58 (FIG. 13), certain ones will now be discussed in further detail with the aid of specific examples. In particular, it is assumed in the following discussion that source 120 (FIG. 7) is operated as a DC sputtering source controlled by OC power supply 122. Since all of the other possible sources and supplies are operated in a substantially similar manner in the invention, the use of this specific example in no way restricts the generality of this discussion.

Referring to FIG. 13, the decision to calibrate the source is made at block 44. Calibration involves establishing both the shape and amplitude of the source distribution using the procedures illustrated in FIGS. 15 and 16.

Figure 15:
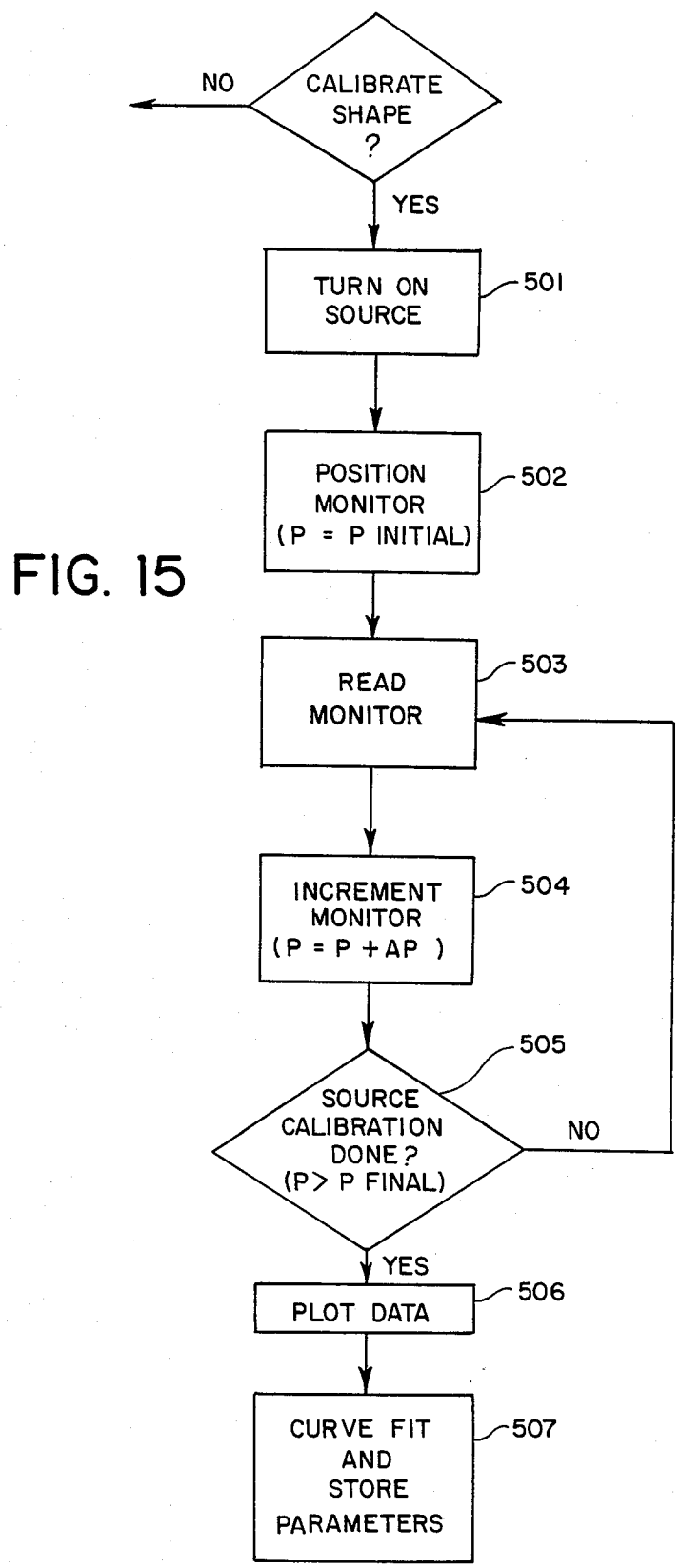
FIG. 15 is a flow diagram of an illustrative source distribution shape calibration program for use in the operation of FIG. 13.
Figure 17:
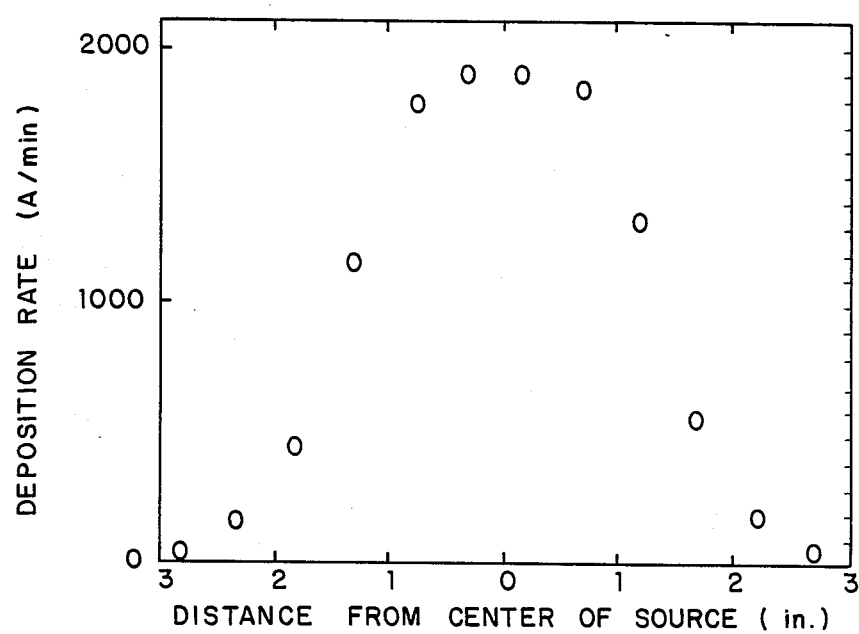
FIG. 17 is a graph of illustrative profiling data obtained in accordance with the program of FIG. 15.
Figure 18:
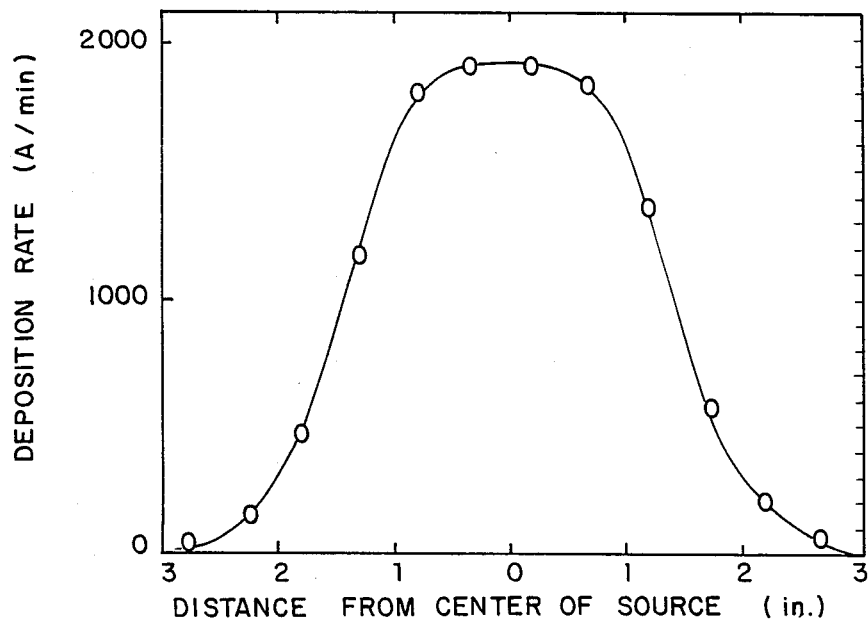
FIG. 18 is a graph illustrating the source profile corresponding to the data of FIG. 17.

Referring to FIG. 15, the procedure for calibrating the shape of the source distribution consists of the following steps. Block 501 involves turning on the source using power supply settings appropriate to the deposition rate of interest. (The power supply settings are not critical, since the shape of the source distribution is usually independent of deposition rate, at least to first order.) Block 502 involves moving the deposition monitor to an appropriate initial position at the edge of the source distribution. In block 503 the deposition rate measured by the deposition monitor is recorded. Block 504 consists of incrementing the monitor position a specified amount (pre-determined by the curve fitting accuracy requirements). In block 505 the monitor position is checked to see if the shape-calibration data acquisition has been completed, i.e., if the deposition monitor has completely scanned the source distribution. If not, the procedure loops back to block 503 and another data point is recorded. When data acquisition has been completed the data is plotted, as indicated in block 506. An example of such a plot is shown in FIG. 17. As indicated by block 507, the shape calibration program also effects the curve fitting necessary to store the source distribution shape in parametric form for use later in the flow diagram of FIG. 13. FIG. 18 shows the curve fit to the data of FIG. 17. As part of the curve fitting routine, the true center of the source distribution is determined, since this, rather than the source geometric center, is the nominal source position of interest.

Figure 16:
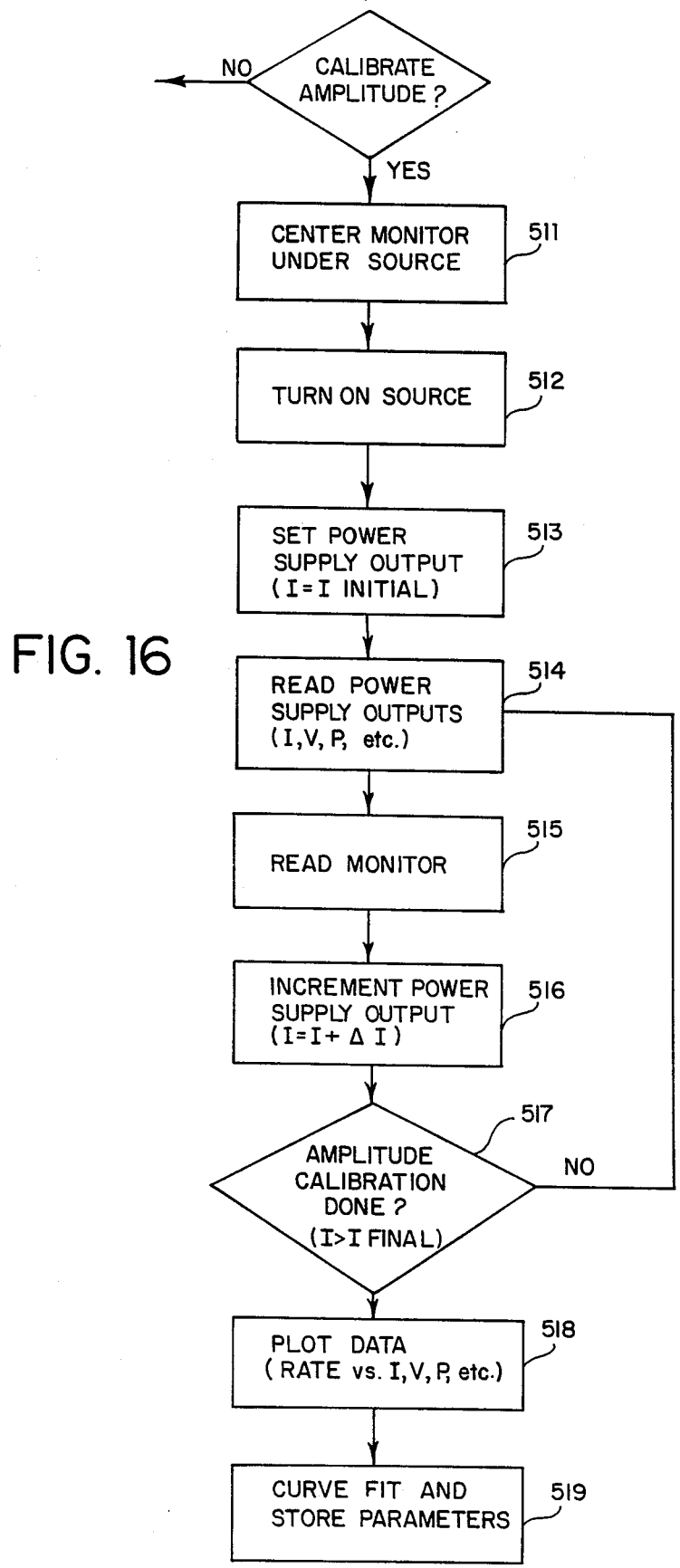
FIG. 16 is a flow diagram of an illustrative source calibration program for correlating source peak deposition rates to respective source electrical inputs for use in the operation of FIG. 13.

The procedure for calibrating the peak amplitude (deposition rate) of the source distribution as a function of power supply settings is illustrated in FIG. 16. In this instance, the deposition monitor is first positioned at the true center of the source distribution, as indicated by block 511. The source is then turned on using a specific power supply setting at the lower end of the range of interest, as indicated by blocks 512 and 513, respectively. In the present example of a DC sputtering source, this involves setting the power supply current. As indicated by block 514, all relevant power supply electrical outputs are recorded at this time, including current, voltage, and/or power. The deposition rate measured by the deposition monitor is then recorded, as indicated by block 515. At this point the power supply current setting is incremented a pre-determined amount (as established by the curve fitting accuracy requirements), and then checked to see if it is still in the calibration range of interest, as indicated by blocks 516 and 517, respectively. If so, the procedure loops back to block 514 and another set of data is recorded for this new current setting. When the amplitude calibration has been completed, the data is plotted (block 518), curve fitted (block 519), and then stored in parametric form for use later in the flow diagram of FIG. 13.

Figure 4:
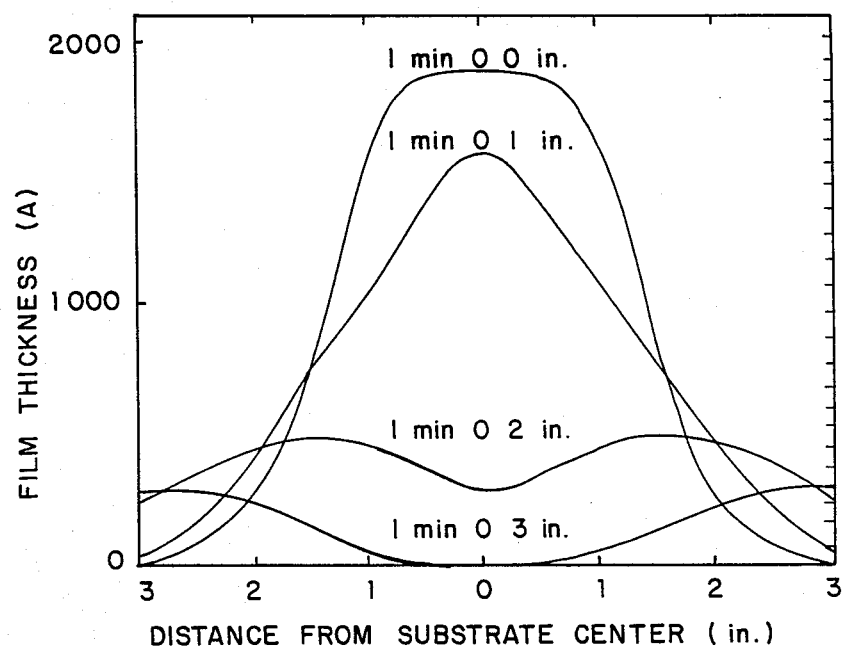
FIG. 4 illustrates a set of hypothetical processing profiles.
Figure 19:
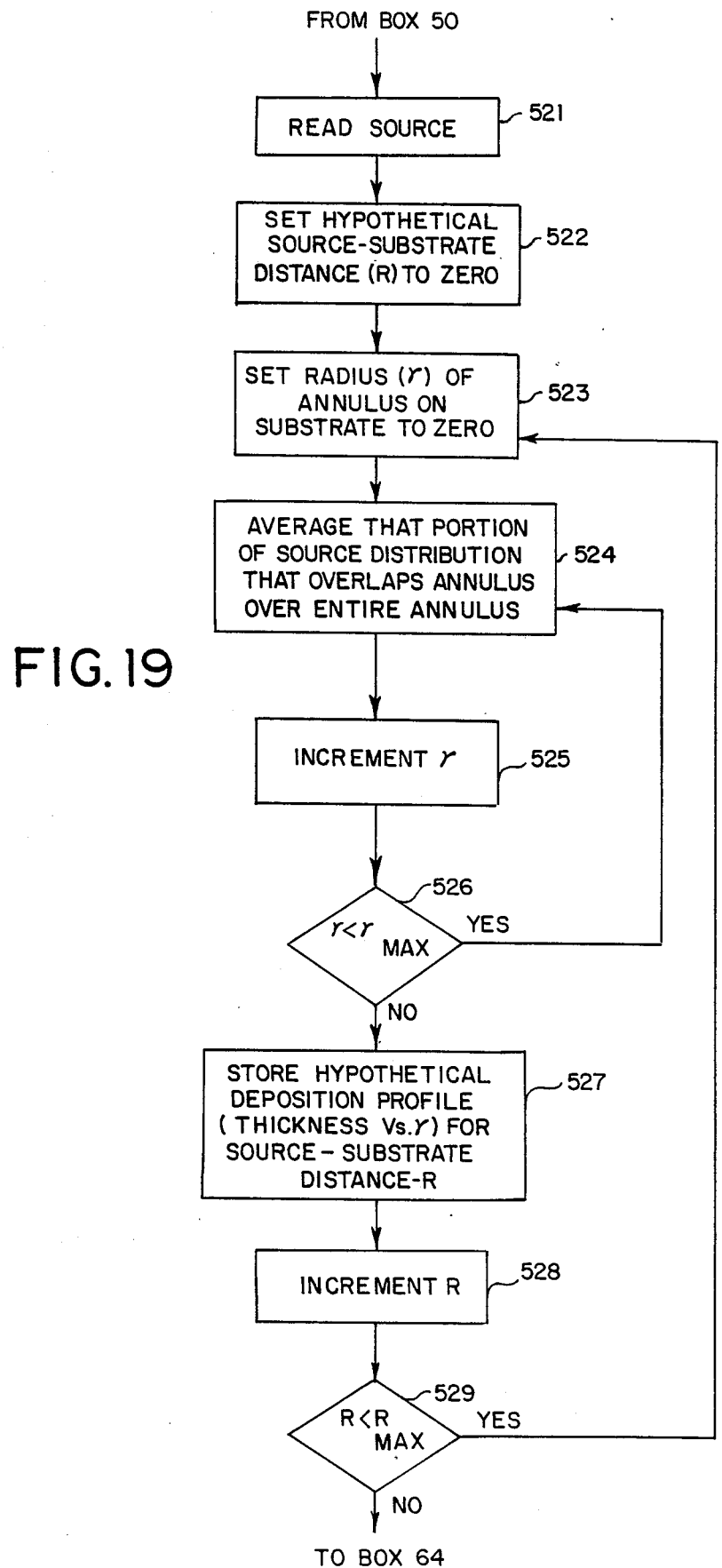
FIG. 19 is a flow diagram of a program for effecting an illustrative source/planet model in accordance with the source/planet modeling routine of FIG. 13.

Referring to block 52 of FIG. 13, the source/planet modeling program uses the source distribution determined by the source calibration program (block 50) to calculate a complete set of hypothetical deposition profiles as a function of source-substrate relative positioning. This procedure is illustrated in more detail in FIG. 19, where the source distribution amplitude and shape are read in at block 521. Block 522 is a program initialization step, and involves setting the hypothetical source-to-substrate center-to-center distance to zero. Block 523 is a similar initialization step, and involves setting the hypothetical substrate annulus radius to zero. That portion of the source distribution that overlaps a substrate annulus of specified radius at a specified source-to-substrate distance is then averaged over the area of this annulus, as indicated by block 524. (In reality, this averaging occurs because the substrate is spinning relative to the source.) The radius of the substrate annulus is then incremented (block 525) in a manner consistent with the substrate diameter (block 526) until a hypothetical substrate deposition profile (thickness versus substrate radius) is obtained and stored for the specified source-to-substrate distance (block 527). The source-to-substrate distance is then incremented (block 528) over all distances where there may be significant substrate depositions (block 529) to finally obtain a complete set of hypothetical deposition profiles. Specific examples of four such hypothetical substrate deposition profiles were shown in FIG. 4 above. In both instances of incrementing distances (blocks 525 and 528), the increment size is determined by the accuracy requirements for these hypothetical profiles, which are in turn determined by the desired uniformity requirements. The tradeoff is therefore computer computation time versus the ultimate degree of deposition uniformity. In general, enough hypothetical deposition profiles are generated that it is other factors that ultimately limit the deposition uniformity. For the present computer system, this corresponds to computation times of the order of one minute.

Figure 5:
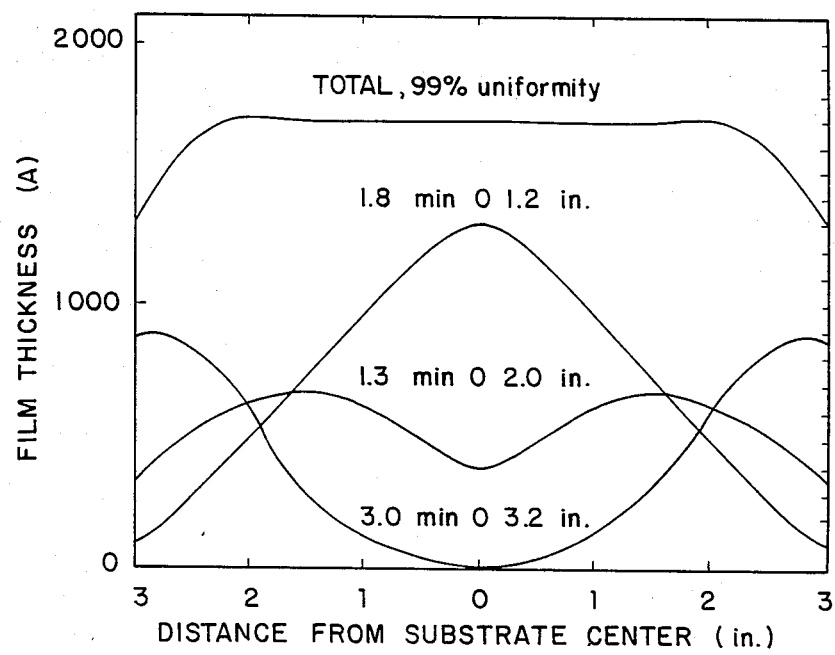
FIG. 5 illustrates an optimized set of hypothetical deposition profiles, including the total (combined) deposition profile.
Figure 20:
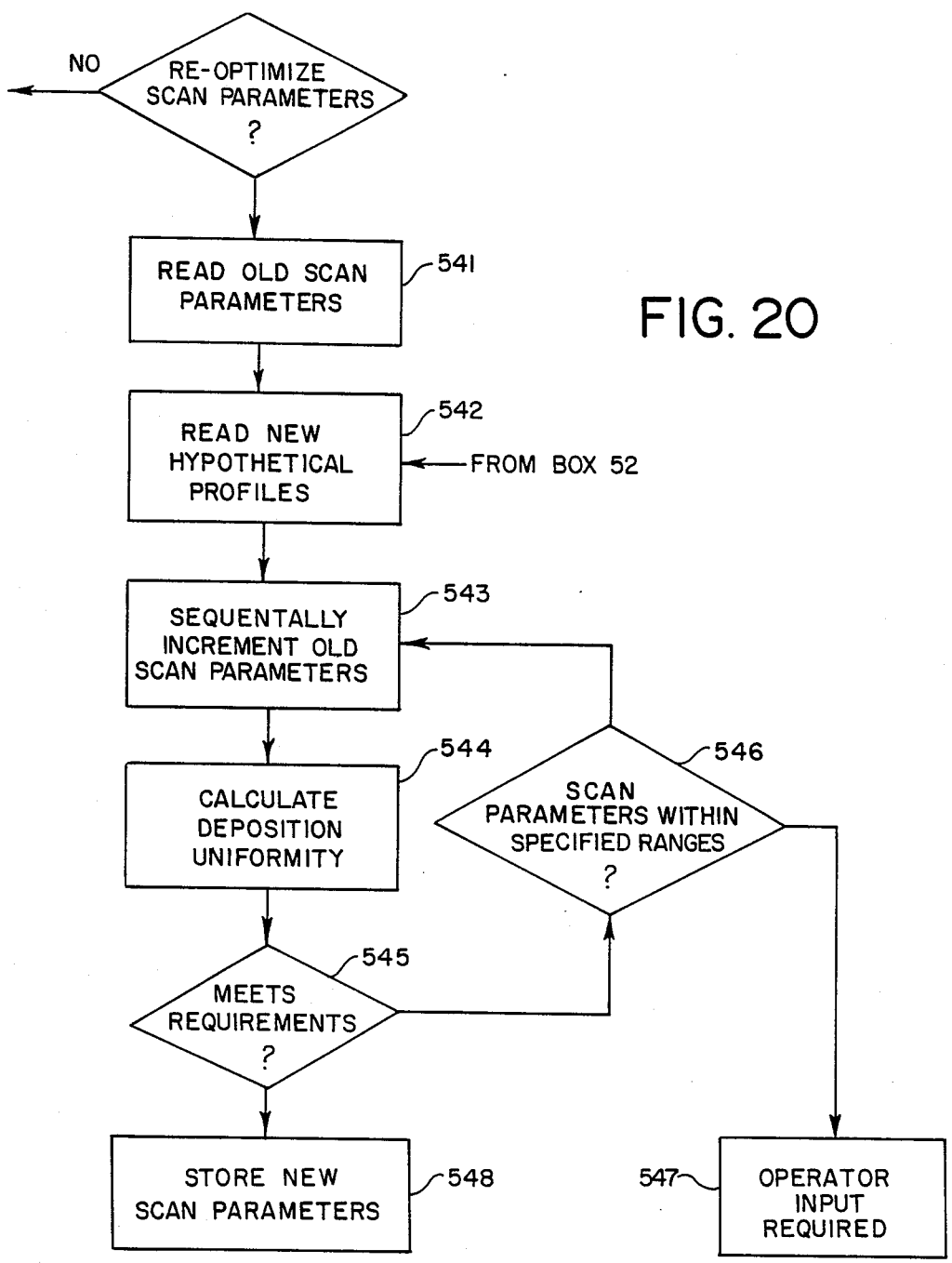
FIG. 20 is a flow chart of a program for effecting an illustrative scan optimization in accordance with the scan optimization routine of FIG. 13.

Referring to block 54 of FIG. 13, the scan optimization program utilizes the hypothetical substrate deposition profiles generated in block 52 as building blocks in selecting and weighting an optimum set that, when combined, correspond to the desired substrate deposition thickness uniformity over an area of specified size. FIG. 5 is an example of a specific set of weighted hypothetical deposition profiles that superimpose to achieve >99% thickness uniformity over a 4-inch diameter substrate. Other factors that influence this selection and weighting process include the planetary deposition mode and the desired deposition homogeneity. An example of the scan optimization program that simultaneously takes into consideration all of these factors would therefore be quite complicated. However, a program for re-optimizing the motion parameters for meeting specified thickness uniformity requirements after a source re-calibration is quite representative of the overall motion scenario optimization program, and is much easier to communicate. Therefore, the example of a re-optimization of motion scenario parameters shown in FIG. 20 is presented, where for simplicity it is assumed that the deposition area, planetary mode, and deposition homogeneity requirements were already addressed in the original optimization of motion scenario parameters for this particular deposition scenario. In this instance, the procedure is to read the old (prior to re-calibration) set of motion scenario parameters, as indicated by block 541. The new hypothetical deposition profiles based on the re-calibrated source distribution are then read in at block 542. Blocks 543, 544 and 545 involve sequentially incrementing the old motion scenario parameters and then calculating the corresponding thickness uniformity to see if it meets the specified requirement. If not, the incrementing of motion scenario parameters will continue as long as they remain within a pre-specified range of the old deposition parameters (block 546). If they are out of range, additional operator input is required, as indicated by block 547. Otherwise, the procedure continues until the required thickness uniformity is achieved. When this occurs, the new motion scenario parmeters are stored (block 548) for use in the computation of deposition parameters (block 56 of FIG. 13).

Figure 21:
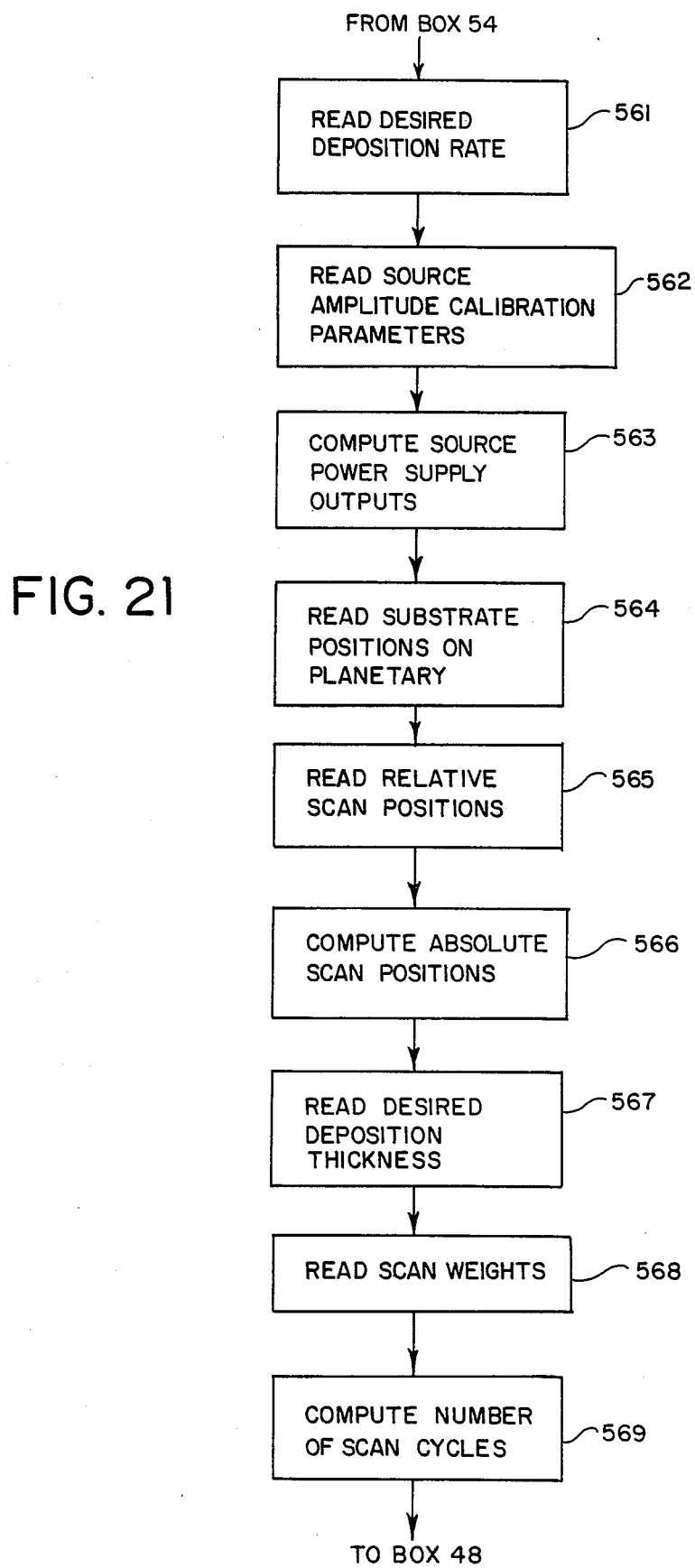
FIG. 21 is a flow diagram of a program for effecting computations of the processing parameters in accordance with the computation of processing parameters routine of FIG. 13.

Finally, an example of the computation of deposition parameters is shown in FIG. 21. This flow diagram is largely self-explanatory, since no loops are involved. Blocks 561, 562, and 563 indicate the sequential steps involved in computing the power supply settings corresponding to the specified deposition rate. Blocks 564, 565, and 566 indicate the sequential steps involved in computing the absolute scan positions (as indicated on the planetary encoder), given the substrate positions on the planetary and the relative scan positions (as referenced to the center of the source) computed in block 54 (FIG. 13). Blocks 567, 568, and 569 indicate the sequential steps involved in calculating the number of deposition cycles (i.e., the number of complete repetitions of deposition positions) required to achieve the specified final deposition thickness, given the stop time at each deposition position. In the nomenclature of this invention, the stop time at each position is the product of the corresponding position weight and a minimum time determined by considerations of deposition homogeneity.

From the foregoing, it can be seen that the present invention offers an unprecedented combination of versatility, efficiency, and high performance. In the current preferred embodiment, it is ideally suited for research and development as well as low-volume production applications. However, it is clear that other embodiments of this invention can be straightforwardly implemented to address a much broader range of applications, including those involving high production. More generally, it will be obvious to those skilled in the art that many modifications may be made within the scope of the present invention without departing from the spirit thereof, and the invention includes all such modifications.

What is claimed is:

1. A physical vapor deposition system comprising:
   at least one substrate;
   at least one source for processing a thin film on the surface of said substrate;
   a source-operating means for operating said source at different sets of values of operating parameters during said thin film processing;
   a motion-and-positioning means for moving said substrate into different positions relative to said source during said thin film processing;
   a calibration means for measuring and predicting the hypothetical processing profiles of said thin film processing, where a said hypothetical processing profile is the amplitude and shape of the result of said thin film processing per unit processing time obtained at any one of said processing positions while using any one of said sets of values of source operating parameters;
   a modeling means for predicting the final processing profile of said thin film on said substrate that results from any specified weighted superposition of said hypothetical processing profiles; and
   a control means for said source-operating means and said motion-and-positioning means for implementing any desired source-operating scenario and motion-and-positioning scenario during said thin film processing in order to effect any said weighted superposition;
   to this predict and achieve a desired range of said final processing profiles of said thin film on said substrate, where said range is limited only by the diversity in shapes of said hypothetical processing profiles.

2. A system as in claim 1 where said range of said final processing profiles of said thin film on said substrate includes a final processing profile that is extremely uniform over the surface of said substrate, irrespective of the size of said substrate relative to said source.

3. A system as in claim 2 where the shape of said substrate is selected from the group of regular shapes consisting of: planar, cylindrical, spherical, polyhedron, and combinations thereof.

4. A system as in claim 1 where said substrate is stationary during said thin film processing.

5. A system as in claim 1 where said source is stationary during said thin film processing.

6. A system as in claim 5 where said motion-and-positioning means includes a flat-plate planetary system with orbital and spin degrees of freedom that comprises:
- a base that is fixed with respect to a plurality of said sources, where said sources are positioned in a substantially planar and circular array opposing said base;
- a turntable rotatably mounted on said base where said turntable is free to rotate about an axis through its center; and
- a plurality of planar substrates rotatably mounted on the circumference of said turntable, such that said planar substrates are free to spin about axes through their centers and where said planar substrates sequentially oppose said sources as a consequence of their orbital motion when said turntable is rotated.

7. A system as in claim 6 where said control means includes means for intermittently orbiting said planar substrates to a plurality of said different orbital processing positions for predetermined periods of time, and source-operating means for effecting said thin film processing at each of said orbital processing positions at predetermined processing rates.

8. A system as in claim 7 where said control means includes means for continuously spinning said planar substrates at each of said orbital processing positions, where said spinning is sufficiently fast that essentially circularly-symmetric spin-averaged processing profiles are obtained at each of said orbital processing positions during said predetermined periods of processing time.

9. A system as in claim 8 where said modeling means includes a computer means for modeling any time-weighted superposition of said spin-averaged processing profiles obtained at each of said orbital processing positions, where said computer means are used to determine a combination of said orbital processing positions and processing times that correspond to any specified spin-averaged said final processing profile.

10. A system as in claim 9 where said calibration means includes means for measuring a source distribution that is cylindrically symmetric about an axis perpendicular to said planar substrates, where said source distribution is said final processing profile obtained on a said planar substrate that is centered with respect to said source.

11. A system as in claim 10 where said calibration means includes a computer model of said motion-and-positioning means that is used to predict the remainder of said spin-averaged processing profiles in terms of the source distribution of any said cylindrically-symmetric source.

12. A system as in claim 6 where said motion-and-positioning means includes a resistance-element heater mounted on a flat-plate shutter that is rotatably mounted with respect to and positioned between said sources and said substrates, where said shutter has an open portion therein that is positioned so that sequential alignment of said open portion with said sources is obtained when said shutter is rotated.

13. A system as in claim 12 where said resistance-element heater is positioned on said shutter so that sequential front-side heating of said substrate occurs when said shutter is rotated.

14. A system as in claim 5 that includes means for heat sinking said substrate without restricting the motion of said substrate relative to said source.

15. A system as in claim 14 where said heat-sinking means includes a phase-change material.

16. A system as in claim 1 where said thin film processing is selected from the group consisting of: depositing, etching, and heating.

17. A system as in claim 16 where said source is used to deposit said thin film on said substrate, where said deposition source is selected from the group consisting of: diode, triode, and magnetron DC/RF sputtering sources, thermal and electron-beam evaporation sources, secondary-ion-beam deposition sources, and molecular-beam-epitaxy sources.

18. A system as in claim 16 where said source is used to etch said thin film on said substrate, where said etching source is selected from the group consisting of: ion-beam etching and milling sources.

19. A system as in claim 16 wherein said source is used to heat said thin film on said substrate, where said heating source is selected from the group consisting of: resistive-element radiative heaters and quartz-tube radiative heaters.

20. A system as in claim 19 where said heating source is a resistive-element heater whose resistance changes with temperature.

21. A system as in claim 20 where said resistance change with temperature is sufficiently large that only one high-vacuum insulated electrical feedthrough is required to simultaneously power, monitor, and regulate the performance of said resistive-element heater.

22. A system as in claim 21 where said positioning means includes means for moving said resistance-element heater relative to a stationary said substrate.

23. A system as in claim 22 wherein said means for moving said resistance-element heater relative to a stationary said substrate includes just one sliding electrical contact bewteen the moving and non-moving portions of said positioning means.

24. A system as in claim 1 where the type of motion used by said motion-and-positioning means in moving between said different processing positions are selected from the group consisting of: constant speed, straight-line, circular, oscillating, orbiting, spinning, continuous, intermittant, and combinations thereof.

25. A system as in claim 1 where said control means for controlling said source-operating means and said motion-and-positioning means includes a computer.

26. A system as in claim 1 where said control means for said source-operating means includes means for continuously varying said values of source-operating parameters so that a continuous range of amplitudes of said fundamental processing profiles are available at each of said different processing positions.

27. A system as in claim 1 where said control means for said motion-and-positioning means includes means for repetitively moving said substrate to said different processing positions in order to enhance the homogeneity of said thin film processing.

28. A system as in claim 1 where said modeling means includes a computer means for modeling any said time-weighted superposition of said hypothetical processing profiles, where said computer means are used to determine a said source-operating scenario and motion-andpositioning scenario that corresponds to any specified said final processing profile.

29. A system as in claim 1 where said calibration means includes measurement means for measuring at least one said fundamental processing profile.

30. A system as in claim 29 where said measurement means includes a computer for data acquisition and analysis means.

31. A system as in claim 29 where said measurement means includes in-situ process monitoring means and means for moving said in-situ process monitoring means relative to said source.

32. A system as in claim 31 where said means for moving said in-situ process monitoring means relative to said source is said motion-and-positioning means.

33. A system as in claim 31 that includes sliding electrical contacts between the moving and non-moving portions of said measurement means.

34. A system as in claim 31 where said in-situ process monitoring means includes a quartz crystal monitor.

35. A system as in claim 34 that includes means for heat sinking said quartz crystal monitor.

36. A system as in claim 34 where said quartz crystal monitor can be used as either a deposition or an etch monitor.

37. A system as in claim 31 where said in-situ process monitoring means includes a thermal monitor.

38. A system as in claim 37 where said thermal monitor includes a thermocouple.

39. A system as in claim 37 where said thermal monitor includes a resistance thermometer.

40. A system as in claim 31 where said in-situ process monitoring means includes an ion-beam current monitor.

41. A system as in claim 40 where said ion-beam current monitor includes a Faraday cup.

42. A system for sequential in-situ heating of stationary substrates in a vacuum system comprising:
    a resistive-element heater, where said resistive element comprises a material with a sufficiently large temperature coefficient of resistance that only one high-vacuum insulated electrical feedthrough is required to power, monitor, and control the performance of said resistive-element heater; and
    a motion-and-positioning means for moving said resistive-element heater to different heating positions with respect to said stationary substrates.

43. A system as in claim 42 where said means for moving said resistive-element heater with respect to said stationary substrates includes just one sliding electrical contact be- tween the moving and non-moving portions of said motion-and- positioning means.

44. A system as in claim 42 where said resistance-element material is platinum.

45. A system as in claim 42 where said resistance element is supported by an electrical insulator.

46. A system as in claim 42 where said resistance-element heater is a thick-film platinum filament patterned onto an alumina substrate.

47. A system for determining source distributions of thin film processing sources in physical vapor deposition systems that comprises:
    an in-situ quartz crystal processing monitor sensitive to the amount of said thin film processing thereon;
    a motion-and-positioning means for at least intermittently moving said processing monitor on a hypothetical surface with respect to said source;
    a data acquisition and analysis means responsive to said processing monitor and said motion-and-positioning means for determining said source distribution, where said source distribution is the result of said thin film processing by said source on a substrate surface coincident with said hypothetical surface.

* * * * *